(12) United States Patent
Sanders et al.

(10) Patent No.: US 8,803,412 B2
(45) Date of Patent: Aug. 12, 2014

(54) SEMICONDUCTOR LAMP

(75) Inventors: Chad N. Sanders, Ashburn, VA (US); J. Michael Phipps, Springfield, VA (US); Jack C. Rains, Jr., Herndon, VA (US); David P. Ramer, Reston, VA (US)

(73) Assignee: ABL IP Holding LLC, Conyers, GA (US)

( * ) Notice: Subject to any disclaimer, the term of this patent is extended or adjusted under 35 U.S.C. 154(b) by 0 days.

(21) Appl. No.: 13/051,662

(22) Filed: Mar. 18, 2011

(65) Prior Publication Data
US 2011/0176291 A1 Jul. 21, 2011

(51) Int. Cl.
| | | |
|---|---|---|
| H05B 33/02 | (2006.01) | |
| F21K 99/00 | (2010.01) | |
| H05B 33/08 | (2006.01) | |
| F21V 23/00 | (2006.01) | |
| F21V 29/00 | (2006.01) | |
| F21V 3/04 | (2006.01) | |
| F21V 3/00 | (2006.01) | |
| F21Y 111/00 | (2006.01) | |
| H01L 33/50 | (2010.01) | |
| F21Y 101/02 | (2006.01) | |

(52) U.S. Cl.
CPC ............ F21K 9/56 (2013.01); *F21V 23/004* (2013.01); *F21V 29/2237* (2013.01); F21K 9/1355 (2013.01); *F21V 3/0436* (2013.01); *F21V 3/0463* (2013.01); *F21V 3/005* (2013.01); *F21Y 2111/005* (2013.01); *F21V 29/006* (2013.01); *F21V 3/0481* (2013.01); *F21V 3/0418* (2013.01); *H01L 33/507* (2013.01); *H01L 33/508* (2013.01); *F21U 2111/007* (2013.01); H05B 33/0803 (2013.01); H05B 33/0857 (2013.01); *F21Y 2101/02* (2013.01); *Y02B 20/386* (2013.01)

USPC .......................................... 313/485

(58) Field of Classification Search
CPC .......................................... F21K 9/00
USPC .................................. 313/483–485
See application file for complete search history.

(56) References Cited

U.S. PATENT DOCUMENTS 1,930,879 A 10/1933 Linderoth et al.
(Continued)

OTHER PUBLICATIONS

US Office Action issued in U.S. Appl. No. 13/051,628, dated Jul. 25, 2011.

(Continued)

*Primary Examiner* — Anh Mai
*Assistant Examiner* — Hana Featherly
(74) *Attorney, Agent, or Firm* — RatnerPrestia

(57) ABSTRACT

A lamp for general lighting applications utilizes solid state light emitters and provides light output that may approximate light emissions from of an incandescent lamp. An exemplary lamp includes a bulb and a pedestal extending into the bulb that supports the light emitters in orientations such that emissions from the emitters through the bulb approximate emissions from a filament of an incandescent lamp. An inner member around the emitters and the pedestal provides further light processing, e.g. diffusing and/or phosphor luminescence. The lamp conforms to form factors and/or uses lamp base connectors of common incandescent lamps and/or compact fluorescent lamps. For efficient substitution of components during manufacture of lamps to different specifications, at least some examples use modular couplings for the parts of the lamp to the heat sink or other housing, such as for couplings of the lamp base, the bulb and the inner light processing member (if provided).

14 Claims, 10 Drawing Sheets

(56) References Cited

U.S. PATENT DOCUMENTS

| | | | |
|---|---|---|---|
| 1,956,133 A | 4/1934 | Rosenblad | |
| 2,061,742 A | 11/1936 | Swart | |
| 2,142,679 A | 1/1939 | Wener | |
| 2,856,161 A | 10/1958 | Flynn | |
| 3,376,403 A | 4/1968 | Driga | |
| 3,486,489 A | 12/1969 | Huggins | |
| 4,543,622 A * | 9/1985 | Menke et al. | 362/219 |
| 4,729,076 A | 3/1988 | Masami et al. | |
| 5,785,418 A | 7/1998 | Hochstein | |
| 5,806,965 A | 9/1998 | Deese | |
| 5,857,767 A | 1/1999 | Hochstein | |
| 6,045,240 A | 4/2000 | Hochstein | |
| 6,247,829 B1 * | 6/2001 | Lee | 362/653 |
| 6,311,764 B1 | 11/2001 | Schulz | |
| 6,431,728 B1 | 8/2002 | Fredericks et al. | |
| 6,450,661 B1 | 9/2002 | Okumura | |
| 6,499,860 B2 | 12/2002 | Begemann | |
| 6,517,217 B1 * | 2/2003 | Liao | 362/235 |
| 6,578,986 B2 | 6/2003 | Swaris et al. | |
| 6,580,228 B1 | 6/2003 | Chen et al. | |
| 6,598,996 B1 | 7/2003 | Lodhie | |
| 6,621,222 B1 | 9/2003 | Hong | |
| 6,682,211 B2 | 1/2004 | English et al. | |
| 6,709,132 B2 | 3/2004 | Ishibashi | |
| 6,712,486 B1 | 3/2004 | Popovich et al. | |
| 6,787,999 B2 | 9/2004 | Stimac et al. | |
| 6,799,864 B2 | 10/2004 | Bohler et al. | |
| 6,864,513 B2 | 3/2005 | Lin et al. | |
| 6,869,545 B2 | 3/2005 | Peng et al. | |
| 6,872,249 B2 | 3/2005 | Peng et al. | |
| 6,880,956 B2 | 4/2005 | Zhang | |
| 6,948,829 B2 | 9/2005 | Verdes et al. | |
| 6,969,843 B1 | 11/2005 | Beach et al. | |
| 6,974,234 B2 | 12/2005 | Galli | |
| 6,991,351 B1 | 1/2006 | Petrick | |
| 7,058,103 B2 | 6/2006 | Ishida et al. | |
| 7,086,767 B2 | 8/2006 | Sidwell et al. | |
| 7,105,051 B2 | 9/2006 | Peng et al. | |
| 7,121,687 B2 | 10/2006 | Sidwell et al. | |
| 7,148,632 B2 | 12/2006 | Berman et al. | |
| 7,153,703 B2 | 12/2006 | Peng et al. | |
| 7,157,745 B2 | 1/2007 | Blonder et al. | |
| 7,160,525 B1 | 1/2007 | Peng et al. | |
| 7,207,695 B2 | 4/2007 | Coushaine et al. | |
| 7,210,832 B2 | 5/2007 | Huang | |
| 7,226,189 B2 | 6/2007 | Lee et al. | |
| 7,273,904 B2 | 9/2007 | Peng et al. | |
| 7,300,187 B2 | 11/2007 | Huang et al. | |
| 7,314,291 B2 | 1/2008 | Tain et al. | |
| 7,338,186 B1 | 3/2008 | Wu et al. | |
| 7,345,320 B2 | 3/2008 | Dahm | |
| 7,396,142 B2 | 7/2008 | Laizure, Jr. et al. | |
| 7,488,093 B1 | 2/2009 | Huang et al. | |
| 7,531,149 B2 | 5/2009 | Peng et al. | |
| 7,543,960 B2 | 6/2009 | Chang et al. | |
| 7,547,124 B2 | 6/2009 | Chang et al. | |
| 7,581,856 B2 | 9/2009 | Kang et al. | |
| 7,588,351 B2 | 9/2009 | Meyer | |
| 7,604,363 B2 | 10/2009 | Burton et al. | |
| 7,641,361 B2 | 1/2010 | Wedell et al. | |
| 7,708,452 B2 | 5/2010 | Maxik et al. | |
| 7,740,380 B2 | 6/2010 | Thrailkill | |
| 7,748,876 B2 | 7/2010 | Zhang et al. | |
| 7,753,560 B2 | 7/2010 | Xu et al. | |
| 7,755,901 B2 | 7/2010 | Shen | |
| 7,768,192 B2 | 8/2010 | Van De Ven et al. | |
| 7,824,075 B2 | 11/2010 | Maxik | |
| 7,845,825 B2 | 12/2010 | Ramer et al. | |
| 7,862,210 B2 | 1/2011 | Zhang et al. | |
| 7,880,389 B2 | 2/2011 | Imai et al. | |
| 8,272,766 B2 | 9/2012 | Phipps et al. | |
| 8,294,339 B2 | 10/2012 | Lin et al. | |
| 8,461,752 B2 | 6/2013 | Sanders et al. | |
| 8,596,827 B2 | 12/2013 | Phipps et al. | |
| 2002/0012246 A1 | 1/2002 | Rincover et al. | |
| 2002/0027775 A1 * | 3/2002 | Gibboney, Jr. | 362/35 |
| 2002/0149025 A1 * | 10/2002 | Andriessen et al. | 257/98 |
| 2004/0135504 A1 * | 7/2004 | Tamaki et al. | 313/512 |
| 2004/0213016 A1 | 10/2004 | Rice | |
| 2004/0251011 A1 | 12/2004 | Kudo | |
| 2005/0068776 A1 | 3/2005 | Ge | |
| 2005/0092469 A1 | 5/2005 | Huang | |
| 2005/0117361 A1 * | 6/2005 | Takeda et al. | 362/509 |
| 2006/0092639 A1 | 5/2006 | Livesay et al. | |
| 2006/0198147 A1 | 9/2006 | Ge | |
| 2007/0241661 A1 | 10/2007 | Yin | |
| 2007/0267976 A1 | 11/2007 | Bohler et al. | |
| 2007/0285926 A1 | 12/2007 | Maxik | |
| 2008/0093963 A1 | 4/2008 | Marien et al. | |
| 2008/0290814 A1 | 11/2008 | Leong et al. | |
| 2009/0002995 A1 * | 1/2009 | Lee et al. | 362/294 |
| 2009/0073697 A1 | 3/2009 | Peck et al. | |
| 2009/0097241 A1 | 4/2009 | Xu et al. | |
| 2009/0251884 A1 | 10/2009 | Rains | |
| 2009/0268461 A1 | 10/2009 | Deak et al. | |
| 2009/0294780 A1 | 12/2009 | Chon et al. | |
| 2009/0295266 A1 | 12/2009 | Ramer et al. | |
| 2009/0296368 A1 | 12/2009 | Ramer | |
| 2009/0315448 A1 * | 12/2009 | Kuze et al. | 313/503 |
| 2010/0027258 A1 | 2/2010 | Maxik et al. | |
| 2010/0073924 A1 | 3/2010 | Deng | |
| 2010/0103678 A1 | 4/2010 | Van De Ven et al. | |
| 2010/0133578 A1 | 6/2010 | Pickard et al. | |
| 2010/0172122 A1 | 7/2010 | Ramer et al. | |
| 2010/0187961 A1 | 7/2010 | Scott | |
| 2010/0207502 A1 | 8/2010 | Cao et al. | |
| 2010/0213808 A1 | 8/2010 | Shi | |
| 2010/0219735 A1 | 9/2010 | Sakai et al. | |
| 2010/0258828 A1 | 10/2010 | Ramer et al. | |
| 2010/0277059 A1 | 11/2010 | Rains, Jr. et al. | |
| 2010/0277067 A1 | 11/2010 | Maxik et al. | |
| 2010/0277069 A1 | 11/2010 | Janik et al. | |
| 2010/0277907 A1 | 11/2010 | Phipps et al. | |
| 2010/0301729 A1 | 12/2010 | Simon et al. | |
| 2010/0314985 A1 | 12/2010 | Premysler | |
| 2010/0315252 A1 | 12/2010 | Desphande et al. | |
| 2011/0019409 A1 | 1/2011 | Wronski | |
| 2011/0045614 A1 | 2/2011 | Helbing et al. | |
| 2011/0051423 A1 | 3/2011 | Hand et al. | |
| 2011/0095686 A1 | 4/2011 | Falicoff et al. | |
| 2011/0140593 A1 | 6/2011 | Negley et al. | |
| 2011/0175520 A1 | 7/2011 | Ramer et al. | |
| 2011/0175528 A1 * | 7/2011 | Rains et al. | 315/51 |
| 2011/0176291 A1 | 7/2011 | Sanders et al. | |
| 2011/0176316 A1 | 7/2011 | Phipps et al. | |
| 2011/0193473 A1 | 8/2011 | Sanders et al. | |
| 2011/0215696 A1 | 9/2011 | Tong et al. | |
| 2011/0278633 A1 | 11/2011 | Clifford et al. | |

OTHER PUBLICATIONS

Pradhan, Narayan, et al., "An Alternative of CdSe Nanocrystal Emitters: Pure and Tunable Impurity Emissions in ZnSe Nonocrystals", Nov. 24, 2005, 127, pp. 17586-17587, J. A, Chem, Soc. Communications, web publication.

"Energy Star Program Requirements for Solid State Lighting Luminaires Eligibility Criteria—Version 1.0", Manual, Sep. 12, 2007.

Yin, Yadong and A. Paul Alivisatos, "Colloidal nanocrystal sythesis and the organic-inorganic interface", Insight Review, Sep. 25, 2005, pp. 664-670, Nature vol. 437.

"Final Report: Highly Bright, Heavy Metal-Free, and Stable Doped Semiconductor Nanophosphors for Economical Solid State Lighting Alternatives", Report, Nov. 12, 2009, pp. 1-3, National Center for Environmental Research, web publication.

"Solid-State Lighting: Development of White LEDs Using Nanophosphor-InP Blends", Report, Oct. 26, 2009, p. 1, U.S. Department of Energy—Energy Efficiency and Renewable Energy, web publication.

"Solid-State Lighting: Improved Light Extraction Efficiencies of White pc-LEDs for SSL by Using Non-Toxic, Non-Scattering, Bright, and Stable Doped ZnSe Quantum Dot Nanophosphors (Phase I)", Report, Oct. 26, 2009, pp. 1-2, U.S. Department of Energy—Energy Efficiency and Renewable Energy, web publication.

(56) References Cited

OTHER PUBLICATIONS

"Chemistry—All in the Dope", Editor's Choice, Dec. 9, 2005, Science, vol. 310, p. 1, AAAS, web publication.
"D-dots: Heavy Metal Free Doped Semiconductor Nanocrystals", Technical Specifications, etc. Dec. 1, 2009, pp. 1-2, NN-LABS, LLC (Nanomaterials & Nanofabrication Laboratories), CdSe/ZnS Semiconductor Nanocrystals, web publication.
U.S. Office Action issued in U.S. Appl. No. 13/051,596, dated Dec. 9, 2011.
United States Office Action issued in U.S. Appl. No. 13/051,628 dated Sep. 26, 2011.
International Search Report and the Written Opinion of the International Searching Authority issued in International Patent Application No. PCT/US12/27862 dated Jul. 13, 2012.
International Search Report and the Written Opinion of the International Searching Authority issued in International Patent Application No. PCT/US12/27869 dated Jul. 13, 2012.
International Search Report and the Wrtten Opinion of the International Searching Authority issued in International Patent Application No. PCT/US12/27856 dated Jul. 13, 2012.
United States Office Action issued in U.S. Appl. No. 13/051,628 dated Jul. 17, 2012.
Untied States Office Action issued in U.S. Appl. No. 13/051,596 dated May 30, 2012.
United States Office Action issued in U.S. Appl. No. 13/051,628 dated Mar. 1, 2012.
Dr. S. Sunderrajan, President, "Delivering Tunable Color Quality with Compromise," Strategies in Light, The Leading Events for the Global LED Lighting Industry, NNCrystal US Corporation, Feb. 2011, p. 1-14.
NNCrystal Poster Displayed at LightFair 2010, May 10-14, 2010.
NNCrystal Corporation Handout at LightFair May 10-14, 2010.
Cree True White Light, 2011.
M. Lamonica, "Cree raises stakes in LED bulb race," CNET News, Jan. 27, 2011, p. 1-4.
M. Lamonica, "Sylvania takes on 60-watt bulb with LED light," CNET News, May 13, 2010, p. 1-5.
M. Lamonica, "GE makes LED replacement for 40-watt bulb," CNET News Apr. 8, 2010, p. 1-5.
C. Lombardi, "Philips offers LED replacement for 60-watt bulb," CNET News, May 12, 2010, p. 1-5.
M. Lamonica, "LEDs keep coming: 60-watt stand-in priced at $30," CNETNews, Dec. 13, 2010, p. 1-5.
"Lighting Science Group Pursues Prestigious L Prize with Revolutionary New LED Bulb," Mar. 8, 2011, p. 1-3.
United States Office Action issued in U.S. Appl. No. 13/051,596 dated Nov. 9, 2012.
Notice of Allowance issued in U.S. Appl. No. 131603,938, Phipps et al., dated Jul. 24, 2013.
Final Office Action issued in U.S. Appl. No. 13/603,938, dated Apr. 4, 2013.
Notice of Allowance issued in U.S. Appl. No. 13/051,596, dated Feb. 4, 2013.
Entire Prosecution of U.S. Appl. No. 13/051,596, to Chad N. Sanders, Filed Mar. 18, 2011, entitled "White Light Lamp Using Semiconductor Light Emitter(s) and Remotely Deployed Phosphor(s)."
Entire Prosecution of U.S. Appl. No. 13/051,628, to J Michael Phipps, Filed Mar. 18, 2011, entitled "Semiconductor Lamp With Thermal Handling System."
Entire Prosecution of U.S. Appl. No. 13/603,938, to J. Michael Phipps, Filed Sep. 5, 2012, entitled "Semiconductor Lamp With Thermal Handling System."

\* cited by examiner

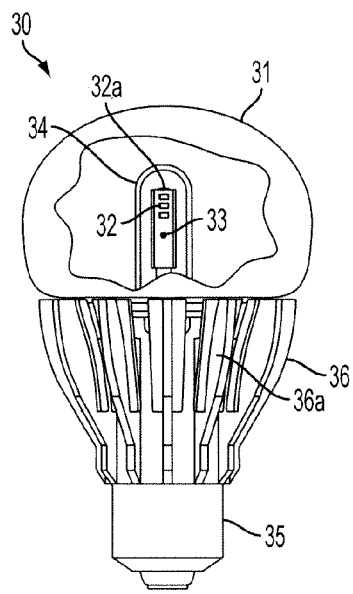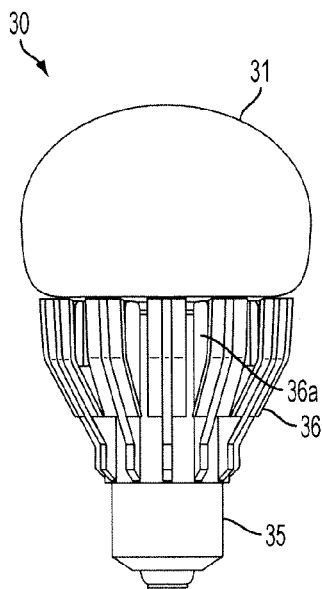
FIG. 1A  FIG. 1B
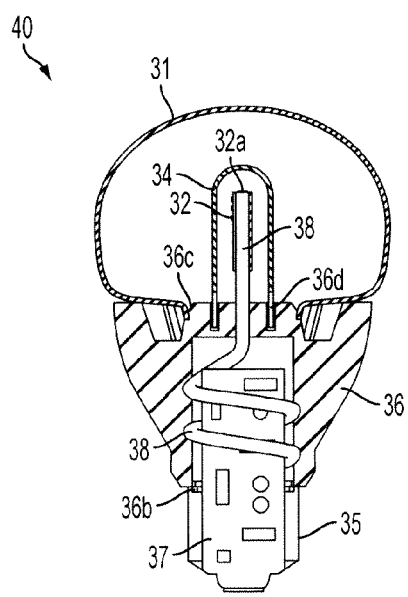
FIG. 2

SEMICONDUCTOR LAMP

TECHNICAL FIELD

The present subject matter relates to lamps for general lighting applications that utilize solid state light emitters to effectively produce and distribute light of desired characteristics, yet can conform to form factors and/or use lamp base connectors of widely accepted lamp designs, such as those of common incandescent lamps and/or compact fluorescent lamps.

BACKGROUND

It has been recognized that incandescent lamps are a relatively inefficient light source. However, after more than a century of development and usage, they are cheap. Also, the public is quite familiar with the form factors and light output characteristics of such lamps. Fluorescent lamps have long been a more efficient alternative to incandescent lamps. For many years, fluorescent lamps were most commonly used in commercial settings. However, recently, compact fluorescent lamps have been developed as replacements for incandescent lamps. While more efficient than incandescent lamps, compact fluorescent lamps also have some drawbacks. For example, compact fluorescent lamps utilize mercury vapor and represent an environmental hazard if broken or at time of disposal. Cheaper versions of compact fluorescent lamps also do not provide as desirable a color characteristic of light output as traditional incandescent lamps and often differ extensively from traditional lamp form factors.

As costs of energy increase along with concerns about global warming due to consumption of fossil fuels to generate energy, there is an ever increasing need for more efficient lamp technologies for general lighting applications: These demands, coupled with rapid improvements in semiconductors and related manufacturing technologies, are driving a trend in the lighting industry toward the use of light emitting diodes (LEDs) or other solid state light emitting sources to produce white light for general lighting applications, as replacements for common incandescent lamps and/or compact fluorescent lamps and other older less efficient light sources.

Thus, there is a need for lamps for general lighting applications that utilize solid state light emitting sources to effectively produce and distribute light of desired characteristics. The lamps utilize energy efficient solid state light emitters, and conform to form factors and/or use lamp base connectors of widely accepted lamp designs, such as those of common incandescent lamps and/or compact fluorescent lamps.

SUMMARY

The teachings herein provide further improvements over existing lighting technologies for providing energy efficient, substantially white light from a lamp utilizing solid state light emitters. The light emissions through the bulb of the lamp, of a lamp that that utilizes solid state light emitters, approximate emissions from an incandescent lamp that uses a filament.

For example, a lamp is provided that includes solid state light emitters, a bulb and a pedestal extending into an interior of the bulb supporting the solid state light emitters in orientations such that emissions from the solid state light emitters through the bulb approximate light source emissions from a filament of an incandescent lamp. An inner member, of a material that is at least partially light transmissive, radially and longitudinally around the solid state light emitters on the pedestal and between an inner surface of the bulb and the solid state light emitters.

The bulb and/or the inner member may be either transparent or diffusely transmissive.

It may also be desirable to provide modular coupling capability in order to efficiently produce solid state lamps, e.g. to different specifications.

For example, a light engine for a lamp, includes a heat sink having a first modular-coupling for attachment of one of a number of different lighting industry standard lamp bases and a second modular-coupling for attachment of one of a number of different types of bulbs. The light engine includes a pedestal extending from the heat sink along the longitudinal axis of the light engine into a region to be surrounded by a bulb when attached to the heat sink. The pedestal provides heat conductivity to and is supported by the heat sink. Solid state light emitters are supported on the pedestal in orientations to emit light outward from the pedestal such that emissions from the solid state light emitters through the bulb when attached to the heat sink approximate light source emissions from a filament of an incandescent lamp.

Additional advantages and novel features will be set forth in part in the description which follows, and in part will become apparent to those skilled in the art upon examination of the following and the accompanying drawings or may be learned by production or operation of the examples. The advantages of the present teachings may be realized and attained by practice or use of various aspects of the methodologies, instrumentalities and combinations set forth in the detailed examples discussed below.

BRIEF DESCRIPTION OF THE DRAWINGS

The drawing figures depict one or more implementations in accord with the present teachings, by way of example only, not by way of limitation. In the figures, like reference numerals refer to the same or similar elements.

FIGS. 1A and 1B are side views of two somewhat similar examples of lamps (differing as to heat sink designs), for lighting applications, which use solid state light emitters to produce white light.

DETAILED DESCRIPTION

Figure 3B:
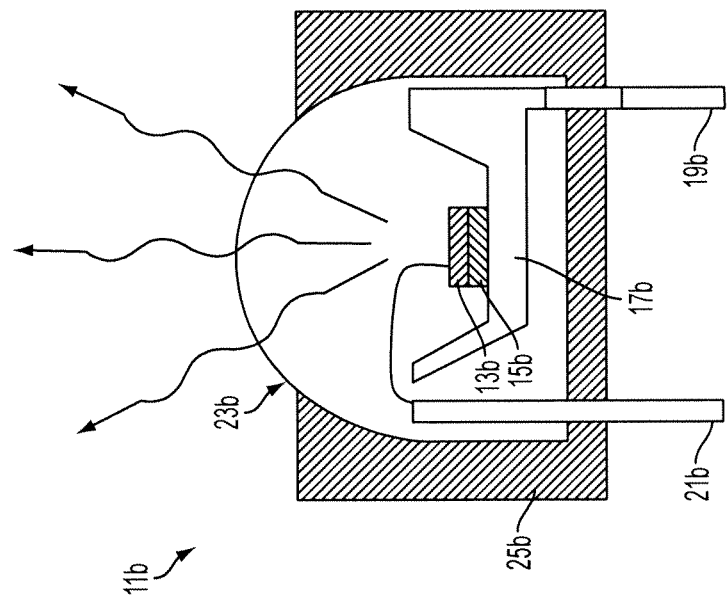
FIG. 3B is a simplified cross-sectional view of a narrower band solid state light emitter which may be used in other lamp examples.

In the following detailed description, numerous specific details are set forth by way of examples in order to provide a thorough understanding of the relevant teachings. However, it should be apparent to those skilled in the art that the present teachings may be practiced without such details. In other instances, well known methods, procedures, components, and/or circuitry have been described at a relatively high-level, without detail, in order to avoid unnecessarily obscuring aspects of the present teachings.

The various examples of solid state lamps disclosed herein may be used in common lighting fixtures, floor lamps and table lamps, or the like, e.g. as replacements for incandescent or compact fluorescent lamps. Reference now is made in detail to the examples illustrated in the accompanying drawings and discussed below.

FIG. 1A illustrates an example of a solid state lamp 30. The exemplary lamp 30 may be utilized in a variety of lighting applications analogous to applications for common incandescent lamps and/or compact fluorescent lamps. The lamp 30 includes solid state light emitters 32 for producing lamp output light of a desired characteristic, from the emitter outputs and/or from luminescent phosphor emissions driven by the emitter outputs as discussed more fully below. The solid state emitters as well as the other components within the bulb 31 are visible through the cut-out window view of FIG. 1A. FIG. 1B is otherwise generally similar to FIG. 1A, minus the cut-out window, except that FIG. 1B also shows a somewhat different implementation of the heat radiation fin configuration of the heat sink.

At a high level, a lamp 30, includes solid state light emitters 32, a bulb 31 and a pedestal 33. The pedestal 33 extends into an interior of the bulb 31 and supports the solid state light emitters 32. The orientations of the solid state light emitters 32 produce emissions through the bulb 31 that approximate light source emissions from a filament of an incandescent lamp. In the examples, an inner optical processing member 34, of a material that is at least partially light transmissive, is positioned radially and longitudinally around the solid state light emitters 32 supported on the pedestal 33 and between an inner surface of the bulb 31 and the solid state light emitters 32. The bulb and/or the inner member may be transparent or diffusely transmissive.

The lamp 30 also includes a heat sink 36 (FIG. 1A) 36' (FIG. 1B). In these examples, the heat sinks are similar but have somewhat different fin/flair arrangements. In either case, the heat sink has a modular-coupling for attachment of one of a number of different lighting industry standard lamp bases 35. The heat sink also has a second modular-coupling for attachment of one of a number of different types of bulbs 31. For examples that include the inner optical processing member 34, the heat sink also has a third modular-coupling for attachment of one of a number of different types of inner optical processing members 34. The base, sink and bulb also enclose circuitry to receive electricity from the lamp base 35, for driving the solid state emitters 32 of the source to emit the light.

The modular couplings facilitate use of certain common components that form a light engine together with different bulbs, bases and/or inner optical processing members for different lamp configurations. The common components forming the engine may include the pedestal, the emitters and the heat sink.

In the examples, the pedestal 33 extends from the heat sink 36 or 36' along the longitudinal axis of the light engine/lamp into a region to be surrounded by the bulb 31 when attached to the heat sink member at the first modular-coupling. The pedestal 33 provides heat conductivity to and is supported by the heat sink 36 or 36'.

In FIG. 1A, the fins 36a have an outward curved profile at their outer edge. The heat sink 36 also includes flares on the fins. In the example of FIG. 1A, the flares are located between the proximal and distal ends of the fins 36a, but the flares are curved inward (as opposed to the outer curve at the perimeter of the fins). In FIG. 1B, the fins 36a' have an angled outer profile at their outer edge. In the example of FIG. 1B, the flares are located at the distal ends of the fins, and the flares are angled to follow the angled outer contour of the fins 36a'. The length of the fins 36a/36a' longitudinally extend from the bulb 31 down to the base 35.

The solid state lamps in the examples produce light that is at least substantially white. In some examples, the solid state emitters produce light that is at least substantially white (FIG. 3A). The white light from the emitters may form the lamp output. In other examples, the emitters produce white light at a first color temperature (FIG. 3B), and phosphor(s) in the lamp converts some of that light so that the lamp output is at least substantially white but at a second color temperature. In these various examples, light is at least substantially white if human observers would typically perceive the light in question as white light.

It is contemplated that the lamp 30 may have a light output formed by only optical processing of the white light emitted by the solid state emitters 32. Hence, the white light output of the lamp 30 would be at least substantially white, in this case as white as the emitters are configured to produce; and that light would be at a particular color temperature. Producing lamps of different color temperatures, using this approach would entail use of different white solid state emitters 32.

Another approach uses the emitters 32 that emit white light at the first color temperature in combination with a remotely deployed material bearing one or more phosphors. Semiconductor nanophosphors, doped semiconductor nanophosphors, as well as rare earth and other conventional phosphors, may be used alone or in various combinations to produce desired color temperatures and/or other desirable characteristics of a white light output. In this type arrangement, the phosphor or phosphors convert at least some portion of the white light (at a first color temperature) from the solid state light emitters from a first spectral characteristic to light of second spectral characteristic, which together with the rest of the light from the emitters produce the white light output from the bulb at a second color temperature.

In other examples the solid state light emitters 32 could be of any type rated to emit narrower band energy and remote phosphor luminescence converts that energy so as to produce a white light output of the lamp. In the more specific examples using this type of phosphor conversion, the light emitters 32 are devices rated to emit energy of any of the wavelengths from the blue/green region around 460 nm down into the UV range below 380 nm. In some examples, the solid state light emitters 32 are rated for blue light emission, such as at or about 450 nm. In other examples, the solid state light emitters 32 are near UV LEDs rated for emission somewhere in the below 420 nm, such as at or about 405 nm. In these examples, the phosphor bearing material may use a combination of semiconductor nanophosphors, a combination of one or more nanophosphors with at least one rare earth phosphor or a combination in which one or more of the phosphors are a doped semiconductor nanophosphor. Each phosphor or nanophosphor is of a type for converting at least some portion of the wavelength range from the solid state emitters to a different range of wavelengths. The combined emissions of the pumped phosphors alone or in combination with some portion of remaining light from the emitters results in a light output that is at least substantially white, is at a desired color temperature and may exhibit other desired white light characteristics.

In several examples offering particularly high spectral white light quality, the substantially white light corresponds to a point on the black body radiation spectrum. In such cases, the visible light output of the lamp deviates no more than ±50% from a black body radiation spectrum for the rated color temperature for the device, over at least 210 nm of the visible light spectrum. Also, the visible light output of the device has an average absolute value of deviation of no more than 15% from the black body radiation spectrum for the rated color temperature for the device, over at least the 210 nm of the visible light spectrum.

Whether using white light emitters (e.g. FIG. 3A) or emitters of energy of wavelengths from the blue/green region around 460 nm down into the UV range below 380 nm (e.g. FIG. 3B), the implementations using phosphors can use different phosphor combinations/mixtures to produce lamps with white light output at different color temperatures and/or of different spectral quality.

Figure 7A:
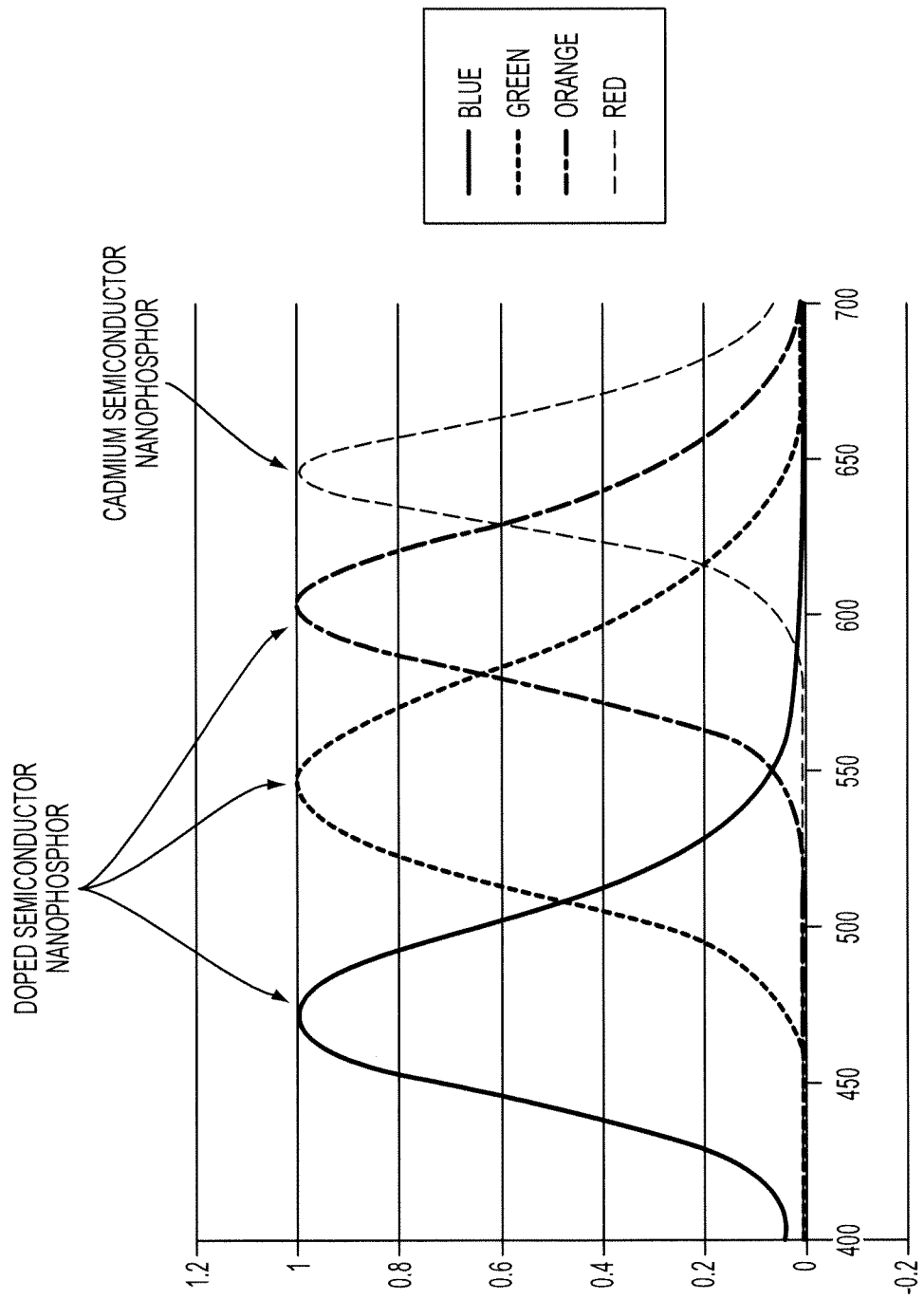
FIG. 7A is a radiation spectral graph, showing the different emission of four phosphors used in several of the examples.
Figures 1, 7B:
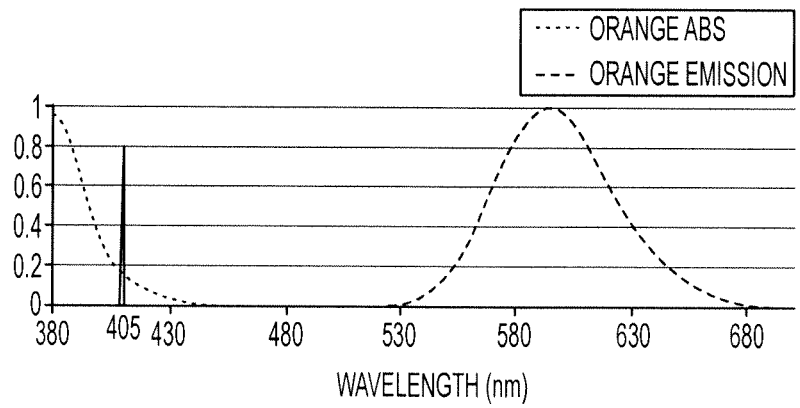
FIG. 7B is a graph of absorption and emission spectra of a number of doped type semiconductor nanophosphors.
Figures 2, 7B:
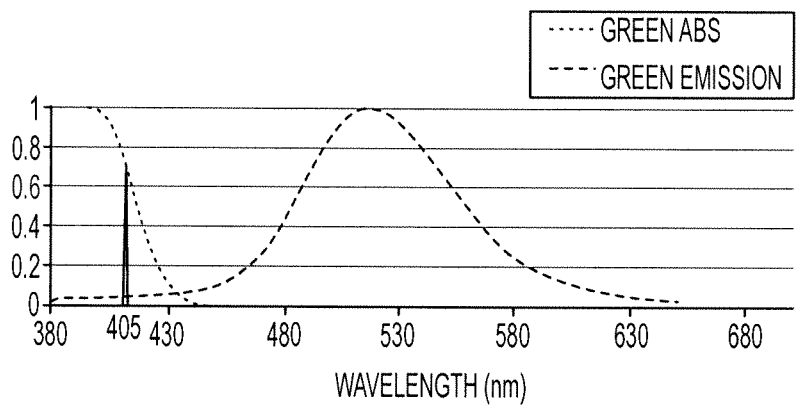
FIG. 2 is a cross-sectional view of an example of a lamp, for lighting applications, which uses solid state light emitters to produce white light.
Figures 3, 7B:
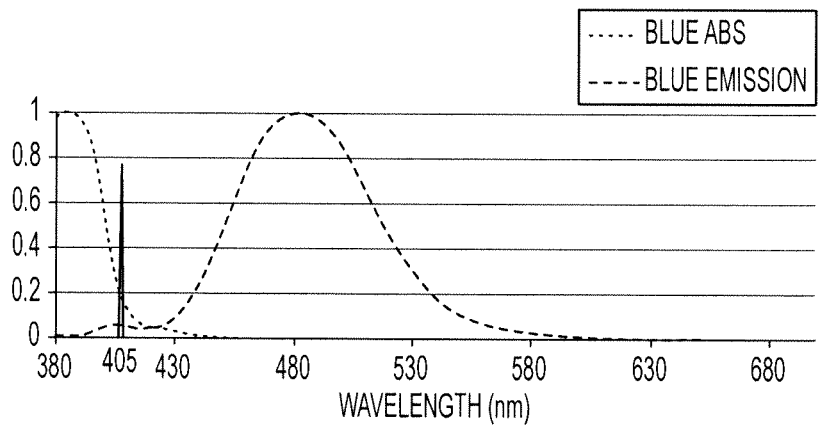

Hence, the lamp structures of FIGS. 1A-2 may be used with a number of different types of emitters alone or in combination with various phosphor materials. In initial examples, the solid state emitters are white light emitters. If phosphors are provided in such implementation, the luminescence of the phosphors changes the color temperature and possibly other characteristics of the white light output of the lamp. Later examples use solid state emitters to emit a predominant wavelength within the excitation range of the phosphor(s) and the pumped phosphor(s) produce the desired white light output.

The solid state light emitters 32 are semiconductor based structures for emitting, in some examples for emitting substantially white light and in other examples for emitting light of color in a range to pump phosphors. In the example, the light emitters 32 comprise light emitting diode (LED) devices, although other semiconductor devices might be used.

As discussed herein, applicable solid state light emitters essentially include any of a wide range light emitting or generating devices formed from organic or inorganic semiconductor materials. Examples of solid state light emitters include semiconductor laser devices and the like. Many common examples of solid state emitters, however, are classified as types of "light emitting diodes" or "LEDs." This exemplary class of solid state light emitters encompasses any and all types of semiconductor diode devices that are capable of receiving an electrical signal and producing a responsive output of electromagnetic energy. Thus, the term "LED" should be understood to include light emitting diodes of all types, light emitting polymers, organic diodes, and the like. LEDs may be individually packaged, as in the illustrated examples. Of course, LED based devices may be used that include a plurality of LEDs within one package, for example, multi-die LEDs that contain separately controllable red (R), green (G) and blue (B) LEDs within one package. Those skilled in the art will recognize that "LED" terminology does not restrict the source to any particular type of package for the LED type source. Such terms encompass LED devices that may be packaged or non-packaged, chip on board LEDs, surface mount LEDs, and any other configuration of the semiconductor diode device that emits light. Solid state lighting elements may include one or more phosphors and/or nanophosphors, which are integrated into elements of the package to convert at least some radiant energy to a different more desirable wavelength or range of wavelengths.

FIG. 3A illustrates an example of a visible white light type LED device, in cross section, by way of a first example 11a of a solid state device of the type discussed herein. The structural configuration of the solid state device 11a shown in FIG. 3A is presented here by way of example only. Those skilled in the art will appreciate that the device may utilize any device structure.

In the example of FIG. 3A, the solid state device 11a includes a semiconductor chip, comprising two or more semiconductor layers 13a, 15a forming the actual LED. In this first example, the semiconductor layers 13a, 15a of the chip are mounted on an internal reflective cup 17a, formed as an extension of a first electrode, e.g. the cathode 19a. The cathode 19a and an anode 21a provide electrical connections to layers of the semiconductor chip within the packaging for the device 11a. When appropriate current is supplied through the cathode 19a and the anode 21a to the LED chip layers 15a and 13a, the chip emits electromagnetic energy. In the example, an epoxy dome 23a (or similar transmissive part) of the enclosure allows for emission of the electromagnetic energy from the device 11a in the desired direction.

The chip structure shown in FIG. 3A is given by way of a simple example, only. Those skilled in the art will appreciate that the device 11a can utilize any semiconductor chip structure. For purposes of this example, the chip structure is configured as a source of energy somewhere in the 380-460 nm range, for example, having substantial energy emissions in that range such as a predominant peak at or about 450 nm. The simplified example shows a LED type semiconductor chip formed of two layers 13a, 15a. Those skilled in the art will recognize that actual chips may have a different number of device layers.

Semiconductor devices such as the light emitting device formed by layers 13a, 15a exhibit emission spectra having a relatively narrow peak at a predominant wavelength, although some such devices may have a number of peaks in their emission spectra. Such devices may be rated with respect to the intended wavelength of the predominant peak, although there is some variation or tolerance around the rated value, from chip to chip due to manufacturing tolerances. The semiconductor chip in the solid state device 11a will have a predominant wavelength in the 380-460 nm range. For example, the chip in the example of FIG. 3A is rated for a 450 nm output, which means that it has a predominant peak in its emission spectra at or about 450 nm (within the manufacturer's tolerance range of that rated wavelength value). Examples of devices 11a, however, may use chips that have additional peaks in their emission spectra.

In the example of FIG. 3A, the white light device 11a also includes a housing 25a. The epoxy may substantially encapsulate the chip. The housing and the light transmissive dome 23a together form the package enclosing the LED chip, in this example. Typically, the housing 25a is plastic, ceramic or in some cases at least partially metallic, e.g. with a metal heat slug (not separately shown) to provide good heat conductivity so as to facilitate dissipation of heat generated during operation of the LED. Internal reflectors, such as the reflective cup 17a, direct energy in the desired direction and reduce internal losses.

The white light emitting device 11a also incorporates an appropriately formulated phosphor material within the device package itself, to enable the device 11 to produce the desired white light. The phosphor material may include a single phosphor or a mixture of phosphors. Each such phosphor may be any of a number of different types of phosphors, such as rare earth phosphors, semiconductor nanophosphors, and doped semiconductor nanophosphors. For white light devices, the material often includes a mixture of two or more of these phosphors. The phosphors are all excited by the energy from the chip, however, the emission spectra of different phosphors in such a mixture are different. Each type of phosphor re-emits visible light of a different spectral characteristic.

The phosphors could be at various locations and formed in various ways within the package of the solid state device 11a. For example, the phosphors could be part of or coated on a reflective material of the cup 17a. In the illustrated example, however, the mix of phosphors is located across the optical output of the solid state device 11a, as shown at 27a in the drawing. The phosphors 27a for example could be in a coating over the outside of an epoxy dome, or the phosphor particles could be doped or otherwise embedded in a portion (as shown) or all of the epoxy forming the dome 23 itself. At least some semiconductor nanophosphors degrade in the presence of oxygen, reducing the useful life of the nanophosphors. Hence, it may be desirable to use materials and construct the device 11 so as to effectively encapsulate the phosphors 27a in a manner that blocks out oxygen, to prolong useful life of the phosphors.

The structural configuration of the solid state light emitter 11a shown in FIG. 3A is presented here by way of example only. Those skilled in the art will appreciate that the lamp examples using white light type emitters can utilize any solid state light emitting device structure that provides light that is at least substantially white. In several examples using such white light emitters, the solid state white light emitters are rated for emitting light that is at least substantially white at a color temperature greater than 4,260° Kelvin, e.g. at 5,000° Kelvin.

Figure 3A:
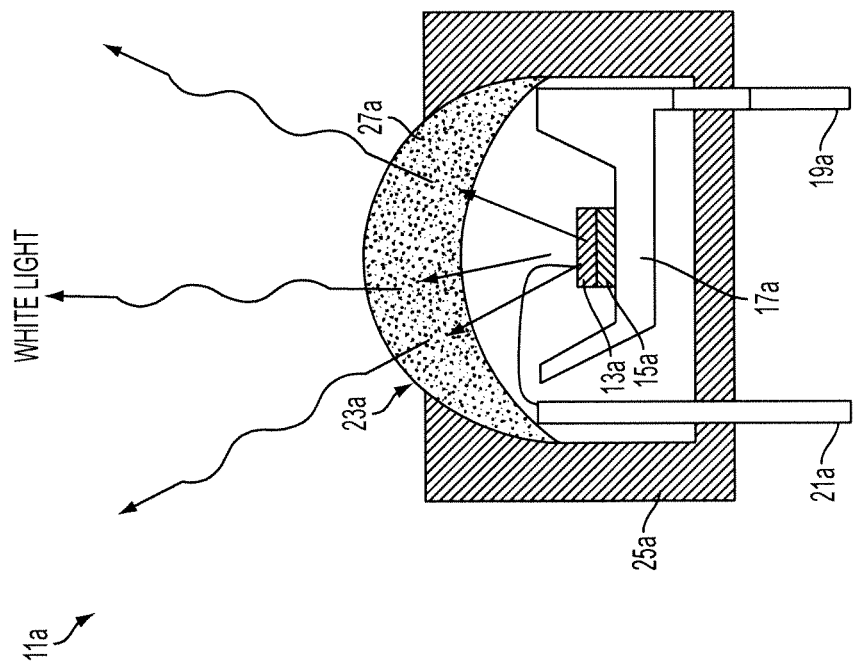
FIG. 3A is a simplified cross-sectional view of a white light solid state light emitter which may be used in some of the lamp examples.

Attention is now directed to FIG. 3B illustrating a simplified cross-sectional view of a narrower band solid state light emitter which may be used in one or more of the lamp examples. FIG. 3B illustrates a simple example of another LED type device 11b, in cross section. The exemplary structure of the LED type device 11b may be used for any device intended to emit non-white light, e.g. rated for a particular or principal color of light emission. For most of the discussions here, the exemplary configuration of the LED type device 11b is for a device rated to emit energy of any of the wavelengths from the blue/green region around 460 nm down into the UV range below 380 nm. Some specific examples are rated for 405 nm emission and other specific examples are rated for 450 nm emission. In the example of FIG. 3B, the solid state light emitter 11b includes at least one semiconductor chip, each chip comprising two or more semiconductor layers 13b, 15b forming the actual LED device. The semiconductor layers 13b, 15b of the chip are mounted on an internal reflective cup 17b, formed as an extension of a first electrode, e.g. the cathode 19b. The cathode 19b and an anode 21b provide electrical connections to layers of the semiconductor chip device within the packaging for the solid state light emitter 11b. In the example, an epoxy dome 23b (or similar transmissive part) of the enclosure allows for emission of the electromagnetic energy from the chip in the desired direction.

In the example shown in FIG. 3B, the solid state light emitter 11b also includes a housing 25b that completes the packaging/enclosure for the solid state light emitter. At least for many modern lighting applications, the housing 25b is plastic or ceramic, e.g. with a metal heat slug (not separately shown) to provide good heat conductivity so as to facilitate dissipation of heat generated during operation of the LED. Internal "micro" reflectors, such as the reflective cup 17b, direct energy in the desired direction and reduce internal losses. One or more elements in the package, such as the reflector 17b or dome 23b may be doped or coated with phosphor materials as in the device of FIG. 3A. However, the solid state emitter used in lamp example 11b relies on remote phosphor deployment to convert narrow band energy to the broader band energy intended to provide white light of desirable quality, therefore, phosphor doping integrated in (on or within) the package is not required. For certain remote phosphor deployment examples, discussed in more detail later, the solid state light emitter 11b in FIG. 3B can be rated to emit electromagnetic energy of a wavelength in the blue/green region around 460 nm down into the UV range below 380, such as at 450 nm or 405 nm.

Semiconductor devices rated for a particular wavelength, such as the solid state light emitter 11b in FIG. 3B, exhibit emission spectra having a relatively narrow peak at a predominant wavelength, although some such devices may have a number of peaks in their emission spectra. Often, manufacturers rate such devices with respect to the intended wavelength $\lambda$ of the predominant peak, although there is some variation or tolerance around the rated value, from device to device. Solid state light emitters such as device 11b for use in certain exemplary lamps will have a predominant wavelength $\lambda$ in the range at or below 460 nm ($\lambda \leq 460$ nm). The lamp may use devices that have additional peaks in their emission spectra.

The structural configuration of the solid state light emitter 11b shown in FIG. 3B is presented here by way of example only. Those skilled in the art will appreciate that the lamp examples can utilize any narrower band solid state light emitting device structure, where the device is configured as a source of electromagnetic energy in the wavelength range that is relevant for excitation of a particular remotely deployed phosphor or phosphor mixture, for example, having substantial energy emissions in that range $\lambda \leq 460$ nm, such as in a range of 380-460 nm.

Turning attention back to FIG. 1A, the solid state light emitters 32 are positioned on the pedestal 33 positioned inside bulb 31. The pedestal 33 extends into the interior of the bulb 31 supporting the solid state light emitters in orientations such that emissions from the solid state light emitters 32 through the bulb 31 approximate light source emissions from a filament of an incandescent lamp. The pedestal 33 includes a multi-surfaced three-dimensional thermal core (discussed in further detail below in FIGS. 5A-5D) that provides support for the solid state light emitters 32 in the interior of the bulb 31. The multi-surfaced three-dimensional thermal core is made of a durable heat conducting material such as copper (Cu), aluminum (Al), thermally conductive plastics or ceramics. An example of a ceramic material is commercially available from CeramTec GmbH of Plochingen, Germany. Composite structures, such as might have a conductive outer material and graphite core or a metal core with an outer dielectric layer are also contemplated. In some cases, the emitters are mounted on a circuit board attached to the core, whereas in other examples, electrical traces for the circuitry may be integrated with the core and the emitters mounted directly to the core without use of an additional circuit board element. Different materials are selected as a trade off of manufacturing cost/complexity versus effective heat transfer.

Figure 4A:
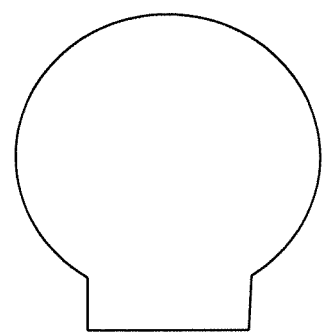
FIGS. 4A-4C are views of several alternate examples of types of bulbs as may be used in place of the bulb in any of the exemplary lamps.
Figure 4B:
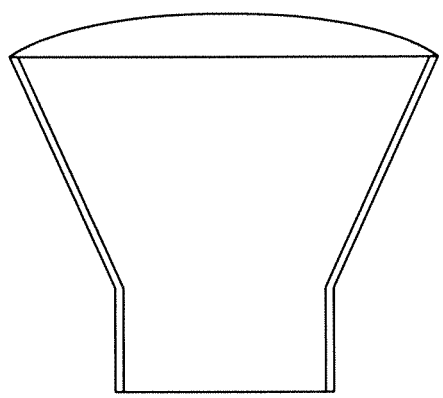
Figure 4C:
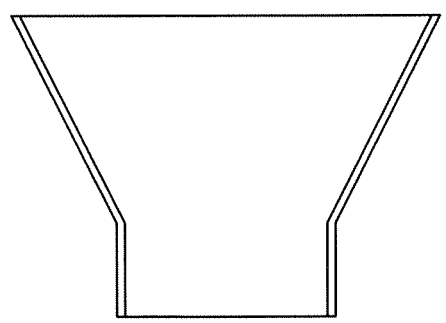

With respect to the shape of the bulbs 31 in FIGS. 1A-2, the bulb and overall lamp shape as well as the light output intensity distribution correspond to current A-lamp parameters. Other bulb structures, however, may be used; and a few examples are presented in FIGS. 4A-4C. FIG. 4A shows a globe-and-stem arrangement for a decorative globe type omni-directional lighting. FIGS. 4B and 4C show R-lamp and Par-lamp style bulbs for different directed lighting applications. As represented by the double lines in the views of FIGS. 4B and 4C, some internal surfaces of the directional bulbs may be reflective, to promote the desired output distributions.

In any of the various shapes, the bulb 31 can be a diffusely transmissive or transparent glass or plastic bulb and exhibit a form factor within standard size, and the output distribution of light emitted via the bulb 31 conforms to industry accepted specifications, for a particular type of lamp product. Other appropriate transmissive materials may be used. For a diffuse outward appearance of the bulb, the output surface may be frosted white or translucent. Those skilled in the art will appreciate that these aspects of the lamp 30 facilitate use of the lamp as a replacement for existing lamps, such as incandescent lamps and compact fluorescent lamps.

Figure 5A:
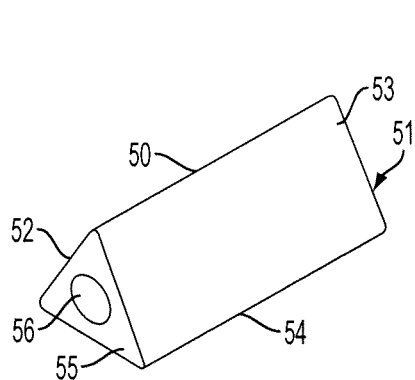
FIG. 5A is a perspective view of the multi-surfaced three-dimensional thermal core.
Figure 5B:
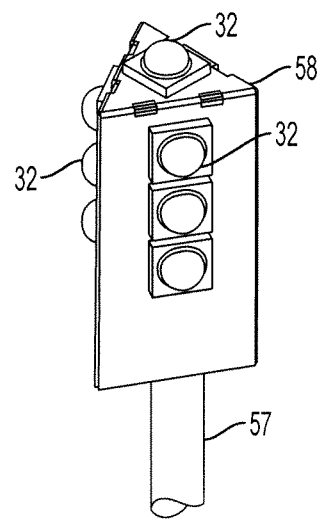
FIG. 5B is a perspective view of the multi-surfaced three-dimensional thermal core on which the solid state light emitters are supported on the core and a portion of a heat transfer mechanism extending from a lower surface of the core.
Figure 5C:
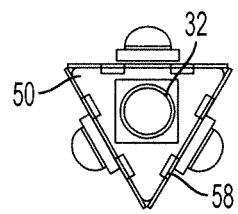
FIGS. 5C and 5D are top and bottom views of the multi-surfaced three-dimensional thermal core and emitters of FIG. 5B.
Figure 5D:
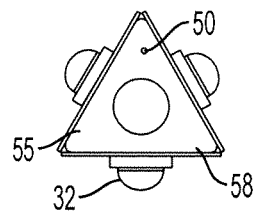

The pedestal 33 supports the solid state emitters 32 by way of a multi-surfaced three-dimensional thermal core providing the support for the solid state light emitters in the interior of the bulb 31. A variety of multi-surfaced shapes may be used for a core 50 to support one or more solid state light emitters. As shown in the example of FIG. 5A, the multi-surfaced three-dimensional thermal core 50 has three lateral surfaces 52, 53, 54 for supporting the solid state light emitters. In the example, the core includes an end face 51 which may or may not support one or more solid state light emitters. Of course, the core may have fewer or more lateral and/or end surfaces for supporting the solid state emitter for outward emission. Also, the example uses a number of emitters, although it may be possible to use as few as one emitter. In FIG. 5B, the solid state light emitters 32 are supported on the three-dimensional thermal core 50. In the example of FIG. 5B, three packaged LEDs are present on each of the lateral surfaces 52, 53, 54, and one LED appears on end face 51. FIGS. 5C and 5D are top and bottom views of the core, LEDs etc. of FIG. 5B.

In addition to the core 51, the pedestal in the example of FIG. 58 includes a portion of a heat transfer element, represented by a heat pipe 57. Those skilled in the art will appreciate that other transfer elements may be used in place of the heat pipe 57, depending on cost/performance considerations. The heat pipe 57 extends from the heat sink along a longitudinal axis of the light engine/lamp into a region surrounded by the bulb. The heat pipe 57 is attached to the heat sink member so as to support the core 51 and thus support the solid state light emitters 32.

Although the core and transfer element may be formed as an integral member, in the example, they are two separate elements joined or attached together. As shown in FIG. 5A, end face 55 includes opening 56 for insertion of the heat pipe 57 into the core. A type of coupling with good heat transfer is provided in one of several ways. For example, a thermal adhesive may be provided, the core may soldered onto the heat pipe 57, or the core may be pressed or heat shrink fitted onto the heat pipe 57.

Figure 5E:
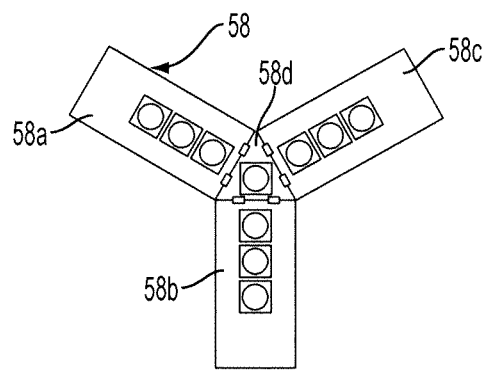
FIG. 5E is a top view of a flexible printed circuit board including the solid state light emitters.
Figure 5F:
FIG. 5F is a side view of the flexible printed circuit board including the solid state light emitters.
Figure 5G:
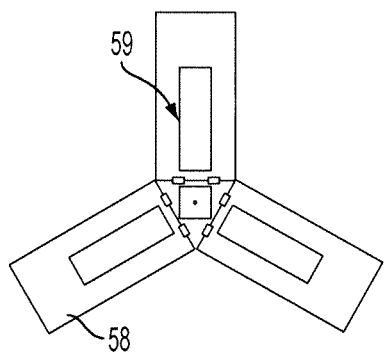
FIG. 5G is a bottom view of a flexible printed circuit board including thermal pads or exposed solid state light emitter heat sinks.

FIG. 5E is a top view of a flexible printed circuit board 58 including the solid state light emitters positioned on tabs 58a, 58b, 58c of the flexible circuit board 58 and a single solid state light emitter on center section 58d. FIG. 5F is a side view of the flexible printed circuit board 58 including the solid state light emitters 32. FIG. 5G is a bottom view of a flexible printed circuit board 58 including thermal pads or exposed solid state light emitter heat sinks.

In the example shown in FIG. 5E, the solid state emitters 32 are mounted on flexible circuit board 58. The board may be rigid with flexibly connected tabs, the entire board may be flexible or some or all of the board may be bendable (e.g. with a bendable metal core). The flexible circuit board is fixedly secured to multi-surfaced three-dimensional thermal core 50 by way of flexible tabs 58a, 58b, 58c on which the solid state emitters 32 are mounted. When installed on the multi-surfaced three-dimensional thermal core 50, each of tabs 58a, 58b, 58c can be bent to allow the tabs 58a, 58b, 58c to be fixedly secured to the lateral sides 52, 53, 54 of the multi-surfaced three-dimensional thermal core 50 by way of solder or a thermally conductive adhesive. End face 58d of the flexible circuit board 58 includes a single solid state emitter 32 and is fixedly secured to end face 51 of the multi-surfaced three-dimensional thermal core 50 by way of solder or a thermally conductive adhesive.

The printed circuit board and emitters may be attached to the faces of the core by an adhesive or a solder. If solder is used, the solder to first attach the emitters to the board may melt at a higher temperature than the solder used to attach the board to the core, to facilitate assembly.

The example in FIGS. 5B-5C shows one emitter on the end face and three emitters on each of the lateral surfaces of the core, with the emitters on each lateral surface arranged in a line approximately parallel to the central longitudinal axis of the core/pipe/engine/lamp. Those skilled in the art will recognize that there may be different numbers of emitters on the end face and/or on any or all of the different lateral surfaces. Also, on any face or surface having a number of emitters, the emitters may be arranged in a different pattern than that shown, for example, so as to adapt emitters in a different type of package or having a different individual output pattern can be arranged such that emissions from the solid state light emitters through the bulb sufficiently approximate light source emissions from a filament of an incandescent lamp.

As shown in FIG. 5E, center tab 58d of the flexible circuit board 58 is connected to each of tabs 58a, 58b, 58c. Although not shown, alternative examples for including the solid state light emitters on the thermal core 50 include packaged solid state light emitters, such as LEDs, positioned on a multi-surfaced three-dimensional solid printed circuit board core. In examples where the circuitry is formed integrally with the core, the core can be a ceramic material or thermally conductive plastic material with electrical traces, or a metallic core (such as aluminum) with a dielectric layer and traces (similar to metal core board construction). In yet another example, light emitting diode dies can be positioned on a multi-surfaced three-dimensional solid printed circuit board core. The core in that example can be a ceramic material or thermally conductive plastic material. As described in further detail below for FIG. 2, a heat pipe or other thermal transfer element can serve a dual role for supporting the solid state emitters and assisting with removal of heat generated during operation of the solid state light emitters.

The lamp base 35 (FIGS. 1A-2) may be any common standard type of lamp base, to permit use of the lamp 30/40 in a particular type of lamp socket. The lamp base 35 may have electrical connections for a single intensity setting or additional contacts in support of three-way intensity setting/dimming. Common examples of lamp bases include an Edison base, a mogul base, a candelabra base and a bi-pin base. It is understood that an adaptor (intermediate to the base 35 and heat sink 36) can be used to accommodate the different sizes of standard lamp bases for attachment at the modular coupling on the heat sink of the lamp 30. For simplicity, two examples of lamp bases are shown in FIGS. 4D and 4E.

Figure 4E:
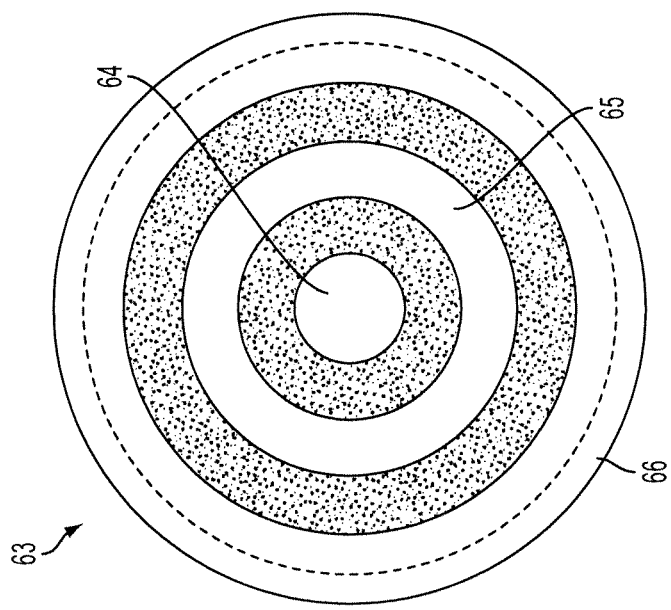
FIG. 4E is a plan view of a three-way dimming screw type lamp base, such as for a three-way mogul lamp base or a three-way medium lamp base.
Figure 4D:
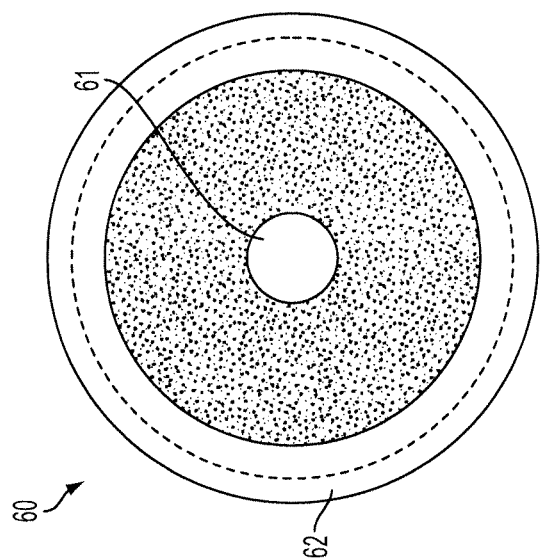
FIG. 4D is a plan view of a screw type lamp base, such as an Edison base or a candelabra base.

FIG. 4D is a plan view of a screw type lamp base, such as an Edison base or a candelabra base. For many lamp applications, the existing lamp socket provides two electrical connections for AC main power. The lamp base in turn is configured to mate with those electrical connections. FIG. 4D is a plan view of a two connection screw type lamp base 60, such as an Edison base or a candelabra base. As shown, the base 60 has a center contact tip 61 for connection to one of the AC main lines. The threaded screw section of the base 60 is formed of metal and provides a second outer AC contact at 62, sometimes referred to as neutral or ground because it is the outer casing element. The tip 61 and screw thread contact 62 are separated by an insulator region (shown in gray).

FIG. 4E is a plan view of a three-way dimming screw type lamp base, such as for a three-way mogul lamp base or a three-way medium lamp base. Although other base configurations are possible, the example is that for a screw-in base 63 as might be used in a three-way mogul lamp or a three-way medium lamp base. As shown, the base 63 has a center contact tip 64 for a low power connection to one of the AC main lines. The three-way base 63 also has a lamp socket ring connector 65 separated from the tip 64 by an insulator region (shown in gray). A threaded screw section of the base 63 is formed of metal and provides a second outer AC contact at 66, sometimes referred to as neutral or ground because it is the outer casing element. The socket ring connector 65 and the screw thread contact 66 are separated by an insulator region (shown in gray).

Many of the components, in the form of a light engine, can be shared between different types/configurations of lamps. For example, the heat sink and pedestal may be the same for an Edison mount A lamp and for three-way A lamp. The lamp bases would be different. The drive circuitry would be different, and possibly the number and/or rated output of the emitters may be different.

The solid state light emitters in the various exemplary lamps may be driven/controlled by a variety of different types of circuits. Depending on the type of solid state emitters selected for use in a particular lamp product design, the solid state emitters may be driven by AC current, typically rectified; or the solid state emitters may be driven by a DC current after rectification and regulation. The degree of control may be relatively simple, e.g. ON/OFF in response to a switch, or the circuitry may utilize a programmable digital controller, to offer a range of sophisticated options. Intermediate levels of sophistication of the circuitry and attendant control are also possible.

As shown in cross-section in FIG. 2, vertically positioned circuit board 37 is illustrated. The circuit board 37 is the circuitry provided for driving the plurality of solid state light emitters and is positioned inside the lamp base 35. In this example the circuit board 37 extends vertically upward from the base in an interior space within the heat sink 36. As shown in FIG. 2, the heat pipe 38 coils around a portion of the circuit board 37. The lamp 40 in FIG. 2 has a lighting industry standard lamp base 35 modularly connected to the heat sink 36 and electrically connected to provide alternating current electricity to the circuit board 37 for driving the solid state light emitters 32 supported on the pedestal.

The examples also encompass heat dissipation technology to provide good heat conductivity so as to facilitate dissipation of heat generated during operation of the solid state light emitters 32. Hence, the exemplary lamp 30 in FIGS. 1A-1B or 40 in FIG. 2 includes one or more elements forming a heat or thermal handling system for receiving heat produced by the solid state light emitters 32 and transferring that heat to a sink for dissipation to the ambient atmosphere. Active dissipation, passive dissipation or a combination thereof may be used, although the illustrated examples do not include an active heat dissipation component. In the examples, the thermal handling system includes the core formed on or attached to a portion of the heat pipe or other heat transfer element and a heat sink coupled to an opposite end of the heat transfer element. The fins 36a/36a' on the heat sink extend along the outside of the lamp between the bulb and the lamp base and include one or more openings or passages between the fins, for allowing flow of air, to dissipate heat from the fins 36a/36a' of the heat sink 36/36'. Although not shown, air passages may also be provided through the coupling of the heat sink to the bulb and or to/from the interior of the inner optical processing member to allow flow of air around the emitters and venting thereof to the exterior of the lamp.

Light emitted from the solid state emitters 32 is permitted to pass out upward and laterally through the bulb 31 and substantially downward between the spacing between adjacent fins 36a/36a'. Thus, light from the solid state emitters is dispersed upwards, laterally and downward, for example, for omni-directional lighting of a room from a table or floor lamp. The orientation shown, however, is purely illustrative. The lamp 30/40 may be oriented in any other direction appropriate for the desired lighting application, including downward, any sideways direction, various intermediate angles, etc.

The light output intensity distribution from the lamp 30/40 corresponds at least substantially to that currently offered by A-lamps. Other bulb/container structures, however, may be used; and a few examples include a bulb-and-stem arrangement for a decorative globe lamp type omni-directional lighting (FIG. 4A), as well as R-lamp (FIG. 4B) and Par-lamp style bulbs (FIG. 4C) for different directed lighting applications. At least for some of the directed lighting implementations, some internal surfaces of the bulbs may be reflective, to promote the desired output distributions.

The heat pipe 38/57 is provided to assist in the removal of heat generated by the solid state emitters 32 present on the pedestal. The heat pipe 57 is a heat transfer mechanism that combines the principles of both thermal conductivity and phase transition to efficiently manage the transfer of heat. In FIG. 2, the solid state light emitters near the end of the heat pipe inside the bulb generate heat. This heat should be effectively removed in order to prolong the operating life of the solid state emitters. At the hot interface within the heat pipe, a liquid contained within the heat pipe comes into contact with a thermally conductive solid surface adjacent to the solid state light emitters and turns into a vapor by absorbing heat from that surface. The vapor condenses back into a liquid at a cold interface away from the solid state light emitters, releasing the latent heat to the heat sink for dissipation through the fins to the air in the gaps between adjacent fins 36a/36a' of the heat sink 36/36'. The liquid then returns to the hot interface adjacent the light emitters through capillary action where it evaporates once more and repeats the cycle. In addition, the internal pressure of the heat pipe can be set or adjusted to facilitate the phase change depending on the demands of the working conditions of the lighting application of the lamp.

The modularity of the solid state lamp will now be described further with reference to FIG. 2. The heat sink 36 includes a first modular-coupling 36b for attachment of one of the various different lighting industry standard lamp bases 35. The heat sink 36 also includes a second modular-coupling 36c for attachment of one of the different types of bulbs 31 each corresponding to a respective one of the applicable industry standard types of lamps. The heat sink 36 has an optional third modular-coupling 36d for attachment of one of a number of different types of light transmissive optical processing members 34 radially surrounding and spaced from the solid state light emitters 32. The optical processing member 34 may be transparent or diffusely transmissive, without phosphor. In most examples, however, the member 34 also serves as the carrier for providing remote deployment of a phosphor material to process light from the solid state emitters 32. Different phosphor mixtures or formulations, deployed by different members 34 enable different instances of the lamp to produce white light as an output of the lamp through the bulb at different color temperatures. Some different phosphor formulations also offer different spectral qualities of the white light output. Remote deployment of the phosphor(s) is discussed further below.

As further shown in FIG. 2, the heat pipe 38 extends upward from the heat sink 36 along a longitudinal axis of the light engine into a region to be surrounded by the bulb 31 when attached to the heat sink 36 at the second modular-coupling 36c, the heat pipe 38 providing heat conductivity to and being supported by the heat sink 36. Multiple solid state light emitters 32 are supported on the heat pipe in orientations to emit light outward from the pedestal such that emissions from the solid state light emitters 32 through the bulb 31 when attached to the heat sink 36 approximate light source emissions from a filament of an incandescent lamp as discussed above with regard to earlier examples.

As noted earlier, a variety of multi-surfaced shapes may be used for a core to support one or more solid state light emitters. In the example shown in FIG. 2, the heat pipe end supporting the solid state light emitters 32 and positioned within the cavity of bulb 31, can be molded or shaped in a multi-surfaced three-dimensional core with three lateral surfaces to support the solid state light emitters 32. Thus, in this example, the heat pipe also integrates the core of the pedestal for supporting the solid state emitters. In the example shown in FIG. 1A, the pedestal includes a multi-surfaced three-dimensional thermal core 33 and an end of the heat pipe together providing the support for the solid state light emitters 32, and the multi-surfaced three-dimensional thermal core 33 has three lateral surfaces (FIG. 5A) supporting solid state light emitters 32 and an end face 51 supporting at least one solid state light emitter 32. As further shown in FIG. 2, circuitry in the form of circuit board 37, is at least partially enclosed by the heat sink connected to drive the solid state emitters 32 in response to electricity received from lamp base 35 when attached to the heat sink 36 at the first modular-coupling 36b.

The modular coupling capability of the heat sink 36, together with the bulb and base that connect to the heat sink, provide a 'light engine' portion of the lamp for generating white light. Theoretically, the engine and bulb could be modular in design to allow a user to interchange glass bulbs, but in practice the lamp is an integral product. The light engine may be standardized across several different lamp product lines (A-lamps, R-lamps, Par-lamps or other styles of lamps, together with Edison lamp bases, three-way medium lamp bases, etc.). The modularity facilitates assembly of common elements forming the light engine together with the appropriate bulb and base (and possibly different drive circuits on the internal board), to adapt to different lamp applications/configurations.

As referenced above, the lamp described in certain examples will include or have associated therewith remote phosphor deployment. The phosphor(s) will be external to the solid state light emitters 32. As such, the phosphor(s) are located apart from the semiconductor chips of the solid state emitters used in the particular lamp, that is to say remotely deployed with respect to the solid state emitters. The phosphor(s) are of a type for converting at least some portion of light from the solid state light emitters from a first spectral characteristic to a second spectral characteristic, to produce a white light output of the lamp from the bulb.

As shown in FIGS. 1A-2, an inner optical processing member 34 remotely deploys the phosphor(s) with respect to the solid state light emitters 32. In conjunction with the phosphor bearing inner member 34, or as an alternative, the phosphor can be deployed on an inner surface of the bulb 31 facing the solid state light emitters. Although one or both may be transparent, the inner member 34 alone, or together with the bulb 31 can be diffusely transmissive.

For the lamp implementations with remotely deployed phosphor, the member and its support of the phosphor may take a variety of different forms. Solid examples of the member 34 may be transparent or diffusely transmissive. Glass, plastic and other materials are contemplated for the member 34. The phosphors may be embedded in the material of the member or may be coated on the inner surface and/or the outer surface of the member 34. The member may also allow air flow, for example, through passages (not shown). In another approach, the member 34 is formed of a permeable mesh coated with the phosphor material.

The inner member 34 of the examples shown in FIGS. 1A-2, is a cylinder and dome like structure. Those skilled in the art will recognize that other shapes may be used for the member, such as a globe on a stalk, a hemisphere or even multi-sided shapes like various polygon shapes. The inner member 34 is positioned around the solid state light emitters 32 and can include one or more remotely deployed phosphors. In a particular example, one or more semiconductor nanophosphors can be dispersed on the inner member, such as by spray coating (or other industry recognized phosphor application technique) of the one or more semiconductor nanophosphors with a carrier/binder on a transmissive or diffusely transmissive surface of the inner member 34.

As outlined earlier, the solid state lamps in the examples produce light that is at least substantially white. Although output of the light from the emitters may be used, the color temperature and/or spectral quality of the output light may be relatively low and less than desirable, particularly for high end lighting applications. Thus, many of the examples add remote phosphor to improve the color temperature and/or spectral qualities of the white light output of the lamps.

A variety of conventional phosphors may be used. Recently developed quantum dot (Q-dot) phosphors or doped quantum dot (D-dot) phosphors may be used. Phosphors absorb excitation energy then re-emit the energy as radiation of a different wavelength than the initial excitation energy. For example, some phosphors produce a down-conversion referred to as a "Stokes shift," in which the emitted radiation has less quantum energy and thus a longer wavelength. Other phosphors produce an up-conversion or "Anti-Stokes shift," in which the emitted radiation has greater quantum energy and thus a shorter wavelength. Quantum dots (Q-dots) provide similar shifts in wavelengths of light. Quantum dots are nano scale semiconductor particles, typically crystalline in nature, which absorb light of one wavelength and re-emit light at a different wavelength, much like conventional phosphors. However, unlike conventional phosphors, optical properties of the quantum dots can be more easily tailored, for example, as a function of the size of the dots. In this way, for example, it is possible to adjust the absorption spectrum and/or the emission spectrum of the quantum dots by controlling crystal formation during the manufacturing process so as to change the size of the quantum dots. Thus, quantum dots of the same material, but with different sizes, can absorb and/or emit light of different colors. For at least some exemplary quantum dot materials, the larger the dots, the redder the spectrum of re-emitted light; whereas smaller dots produce a bluer spectrum of re-emitted light. Doped quantum dot (D-dot) phosphors are similar to quantum dots, but are also doped in a manner similar to doping of a semiconductor. Variation in the proportions or percentages of different phosphors with respect to the total amount of phosphors in a mix adapts a particular lamp design to output different color temperatures of white light.

In some examples using phosphor luminescence, the solid state emitters produce light that is at least substantially white. In certain white light examples, the solid state light emitters are emitters for emitting light that is at least substantially white at a color temperature greater than 4,260° Kelvin, e.g. at a first color temperature of approximately 5,000° Kelvin or even higher. In these implementations, phosphor(s) remotely deployed in the lamp via the member 34 convert some of that light so that the lamp output is at least substantially white, but at a second color temperature lower than the first color temperature. In these examples, the phosphors are selected and mixed so as to convert enough of the light at the first color temperature to produce a combined output of the lamp that exhibits color temperature in one of four specific ranges along the black body curve listed in Table 1 below.

TABLE 1

Nominal Color Temperatures and Corresponding Color Temperature Ranges

| Nominal Color Temp. (° Kelvin) | Color Temp. Range (° Kelvin) |
|---|---|
| 2700 | 2725 ± 145 |
| 3000 | 3045 ± 175 |
| 3500 | 3465 ± 245 |
| 4000 | 3985 ± 275 |

In Table 1, each nominal color temperature value represents the rated or advertised temperature as would apply to particular lamp having an output color temperature within the corresponding range.

As noted a variety of phosphors may be used. In the examples using white light emitters, for example, mixtures of quantum dot (Q-dot) type semiconductor nanophosphors are available to produce the white light output at the desired color temperature. To improve the spectral quality of the output light a rare earth phosphor may be added to or substituted into a mixture of the quantum dot (Q-dot) type semiconductor nanophosphors, for any one or each of the mixtures for producing the output in the desired color temperature range. The excited phosphor(s) together with light from the emitters produce output light from the lamp that is at least substantially white and has a color rendering index (CRI) of 75 or higher. With any of these phosphor strategies using white light emitters (see e.g., FIG. 3A), the implementations can use different phosphor combinations/mixtures deployed via different instances of the inner member 34 to produce lamps with white light output at different color temperatures and/or of different spectral quality.

One or two of the nanophosphors may be used to produce a relatively mono-chromatic light output or a light output that appears somewhat less than full white to a person. However, in many commercial examples for general lighting or the like, the lamp produces white light of desirable characteristics using a number of semiconductor nanophosphors. The phosphor bearing material may use a combination of semiconductor nanophosphors, or a combination of one or more nanophosphors with at least one rare earth phosphor.

Figure 6A:
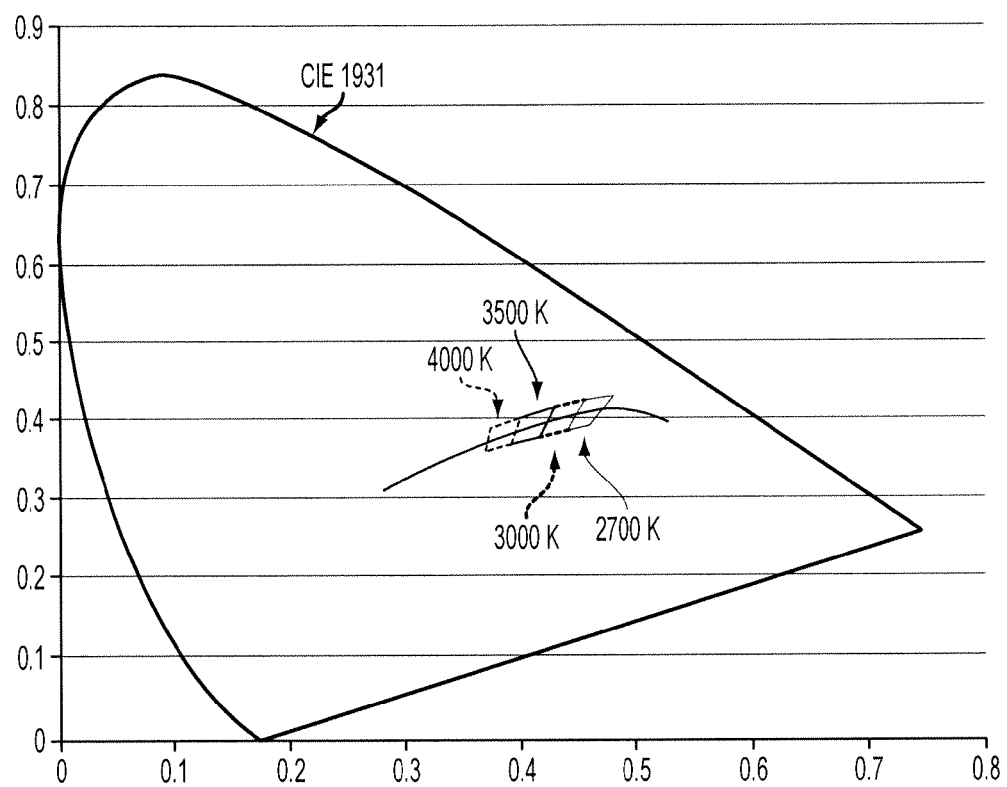
FIGS. 6A and 6B are color charts showing the black body curve and tolerance quadrangles along that curve for chromaticities corresponding to several desired color temperature ranges for lamps configured for white light applications.

In Table 1 above, each nominal color temperature value represents the rated or advertised temperature as would apply to particular lamp using white light LEDs having an output color temperature within the corresponding range. The color temperature ranges fall along the black body curve. FIG. 6A shows the outline of the CIE 1931 color chart, and the curve across a portion of the chart represents a section of the black body curve that includes the desired CIE color temperature (CCT) ranges. The light may also vary somewhat in terms of chromaticity from the coordinates on the black body curve. The quadrangles shown in the drawing represent the respective ranges of chromaticity for the nominal CCT values. Each quadrangle is defined by the range of CCT and the distance from the black body curve. Table 2 below provides chromaticity specifications for the four color temperature ranges. The x, y coordinates define the center points on the black body curve and the vertices of the tolerance quadrangles diagrammatically illustrated in the color chart of FIG. 6A.

TABLE 2

Chromaticity Specification for the Four Nominal Values/CCT Ranges

| | CCT Range | | | | | | | |
|---|---|---|---|---|---|---|---|---|
| | 2725 ± 145 | | 3045 ± 175 | | 3465 ± 245 | | 3985 ± 275 | |
| | Nominal CCT | | | | | | | |
| | 2700° K | | 3000° K | | 3500° K | | 4000° K | |
| | x | y | x | y | x | y | x | y |
| Center point | 0.4578 | 0.4101 | 0.4338 | 0.4030 | 0.4073 | 0.3917 | 0.3818 | 0.3797 |
| | 0.4813 | 0.4319 | 0.4562 | 0.4260 | 0.4299 | 0.4165 | 0.4006 | 0.4044 |
| Tolerance | 0.4562 | 0.426 | 0.4299 | 0.4165 | 0.3996 | 0.4015 | 0.3736 | 0.3874 |
| Quadrangle | 0.4373 | 0.3893 | 0.4147 | 0.3814 | 0.3889 | 0.369 | 0.367 | 0.3578 |
| | 0.4593 | 0.3944 | 0.4373 | 0.3893 | 0.4147 | 0.3814 | 0.3898 | 0.3716 |

Another approach, offering yet higher spectral quality at the specified color temperatures and/or at additional color temperature ranges and listed later (see Table 3), uses solid state light emitters 32 of any type rated to emit energy of wavelengths from the blue/green region around 460 nm down into the UV range below 380 nm (see e.g., FIG. 3B), Some specific examples use a 450 nm type emitter, whereas other specific examples use a 405 nm emitter. In these arrangements, the phosphor bearing material may use a combination of semiconductor nanophosphors, a combination of one or more nanophosphors with at least one rare earth phosphor or a combination in which one or more of the phosphors is a doped semiconductor nanophosphor. For example, with 450 nm type emitters, the mixture may contain one or more semiconductor nanophosphors with at least one rare earth phosphor; whereas with 405 nm type emitters, the mixture may contain one or more doped semiconductor nanophosphors although the mixture may also include a rare earth or other conventional phosphor. Each phosphor or nanophosphor is of a type for converting at least some portion of the wavelength range from the particular solid state emitters to a different range of wavelengths. The combined emissions of the pumped phosphors alone or in combination with some portion of remaining light from the emitters results in a light output that is at least substantially white, is at a desired color temperature and may exhibit other desired white light characteristics.

The selected phosphors are excitable by the relevant spectrum of light from the solid state light emitters 32. When excited by light emitted by the solid state light emitters, each phosphor in a mixture emits visible light in a characteristic emission spectrum.

At least for some types of phosphors, e.g. doped semiconductor nanophosphors, the various emission spectra are separated from the absorption spectra of the nanophosphors included in a light output from the lamp. This tends to reduce re-absorption of phosphor emissions. The upper limits of the absorption spectra of certain nanophosphors are at or below 460 nm, for example, around 430 nm. However, exemplary nanophosphors (particularly doped nanophosphors) are relatively insensitive to other ranges of visible light often found in natural or other ambient white visible light. Hence, when the lamp 30/40 using such phosphors is off, the semiconductor nanophosphors will exhibit little or no light emissions that might otherwise be perceived as color by a human observer. Even though not emitting, the particles of the semiconductor nanophosphor may have some color, but due to their absorption spectrum and location inside the bulb, the overall effect is that the nanophosphor(s) cause little or no perceptible tint.

One or two of the nanophosphors may be used to produce a relatively mono-chromatic light output or a light output that appears somewhat less than full white to a person. However, in many commercial examples for general lighting or the like, the lamp produces white light of desirable characteristics using a number of semiconductor nanophosphors.

With these various types of phosphor mixtures excited by the narrower band energy from the emitters, e.g. from 405 or 450 nm LEDs in our most specific examples, when excited, each phosphor in the lamp re-emits visible tight of a different spectral characteristic. However, each such phosphor emission has a somewhat different spectrum. When excited by the light received from the solid state light emitters, the phosphors together cause the lamp to produce visible light output of a desired characteristic, which is at least substantially white and has a color rendering index (CRI) of 75 or higher. The lamp output light produced by this excitation of the semiconductor nanophosphors exhibits color temperature in one of several desired ranges as specified earlier in Table 3.

TABLE 3

Nominal Color Temperatures and Corresponding Color Temperature Ranges

| Nominal Color Temp. (° Kelvin) | Color Temp. Range (° Kelvin) |
|---|---|
| 2700 | 2725 ± 145 |
| 3000 | 3045 ± 175 |
| 3500 | 3465 ± 245 |
| 4000 | 3985 ± 275 |
| 4500 | 4503 ± 243 |
| 5000 | 5028 ± 283 |
| 5700 | 5665 ± 355 |
| 6500 | 6530 ± 510 |

Figure 6B:
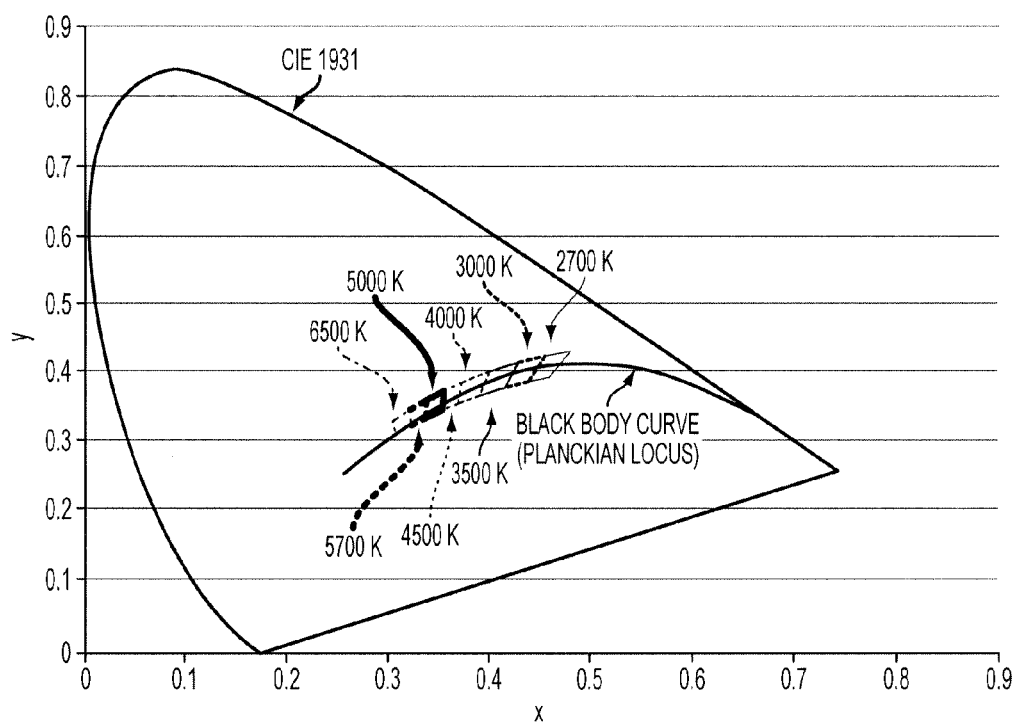

In Table 3, each nominal color temperature value represents the rated or advertised temperature as would apply to particular lamp product having an output color temperature within the corresponding range. The color temperature ranges fall along the black body curve (Planckian locus). FIG. 6B shows the outline of the CIE 1931 color chart, and the curve across a portion of the chart represents a section of the black body curve that includes the desired CIE color temperature (CCT) ranges. The light may also vary somewhat in terms of chromaticity from the color coordinates of points on the black body curve. The quadrangles shown in the drawing represent the respective ranges of chromaticity for the nominal CCT values. Each quadrangle is defined by the range of CCT and the distance from the black body curve. Tables 4 and 5 below provides chromaticity specifications for the eight exemplary color temperature ranges of FIG. 6B. The x, y coordinates define the center points on the black body curve and the vertices of the tolerance quadrangles diagrammatically illustrated in the color chart of FIG. 6B.

TABLE 4

Chromaticity Specification for Nominal Values/CCT Ranges (for rated/nominal CCTs of 2700° K to 4000° K)

| | CCT Range | | | | | | | |
|---|---|---|---|---|---|---|---|---|
| | 2725 ± 145 | | 3045 ± 175 | | 3465 ± 245 | | 3985 ± 275 | |
| | | | | Nominal CCT | | | | |
| | 2700° K | | 3000° K | | 3500° K | | 4000° K | |
| | x | y | x | y | x | y | x | y |
| Center point | 0.4578 | 0.4101 | 0.4338 | 0.4030 | 0.4073 | 0.3917 | 0.3818 | 0.3797 |
| | 0.4813 | 0.4319 | 0.4562 | 0.4260 | 0.4299 | 0.4165 | 0.4006 | 0.4044 |
| Tolerance | 0.4562 | 0.4260 | 0.4299 | 0.4165 | 0.3996 | 0.4015 | 0.3736 | 0.3874 |
| Quadrangle | 0.4373 | 0.3893 | 0.4147 | 0.3814 | 0.3889 | 0.3690 | 0.3670 | 0.3578 |
| | 0.4593 | 0.3944 | 0.4373 | 0.3893 | 0.4147 | 0.3814 | 0.3898 | 0.3716 |

TABLE 5

Chromaticity Specification for Nominal Values/CCT Ranges (for rated/nominal CCTs of 4500° K to 6500° K)

| | CCT Range | | | | | | | |
|---|---|---|---|---|---|---|---|---|
| | 4503 ± 243 | | 5028 ± 283 | | 5665 ± 355 | | 6530 ± 510 | |
| | | | | Nominal CCT | | | | |
| | 4500° K | | 5000° K | | 5700° K | | 6500° K | |
| | x | y | x | y | x | y | x | y |
| Center point | 0.3611 | 0.3658 | 0.3447 | 0.3553 | 0.3287 | 0.3417 | 0.3123 | 0.3282 |
| | 0.3736 | 0.3874 | 0.3551 | 0.3760 | 0.3376 | 0.3616 | 0.3205 | 0.3481 |
| Tolerance | 0.3548 | 0.3736 | 0.3376 | 0.3616 | 0.3207 | 0.3462 | 0.3028 | 0.3304 |
| Quadrangle | 0.3512 | 0.3465 | 0.3366 | 0.3369 | 0.3222 | 0.3243 | 0.3068 | 0.3113 |
| | 0.3670 | 0.3578 | 0.3515 | 0.3487 | 0.3366 | 0.3369 | 0.3221 | 0.3261 |

The solid state lamp could use a variety of different combinations of phosphors to produce any output within a selected one of the CCT and chromaticity ranges of Tables 3-5. The phosphors are selected and combined in amounts that cause the output of the lighting device to exhibit the desired characteristics, in this case, to achieve a color temperature in a particular one of the ranges of Tables 3-5 and a high color rendering index. Different lamps designed for different color temperatures of white output light and/or using different types of narrow band emitter would use different formulations of mixtures of doped semiconductor nanophosphors. For example, combinations of semiconductor nanophosphors alone or with addition of a rare earth phosphor can produce such light when driven by a narrow band type LED rated for blue-green emission, such as a 450 nm LED. Semiconductor nanophosphors as might be used in these examples are available from NNCrystal of Fayetteville, Ark. and from QD Vision of Watertown, Mass. Conventional phosphors, including rare earth phosphors, for use with the semiconductor nanophosphors are available from a variety of vendors.

Some phosphor mixes can provide higher quality spectral content in the desired temperature ranges, for example, including close correspondence to or approximation of a section of the black body radiation spectrum for the rated color temperature. For these still higher light quality lamp products, our examples use at least two doped semiconductor nanophosphors that may be excited by at least some wavelengths in the 380-460 nm range. In certain of these examples, each solid state light emitter 32 is a near UV emitting LED, such as a 405 nm LED. Although other types of semiconductor nanophosphors are contemplated, we will also assume for the following discussion of these black body quality examples that each nanophosphor is a doped semiconductor of a type excited in response to light from the solid state light emitters.

Different black body quality examples of lamps designed for different color temperatures of white output light would according to Tables 3-5 use different formulations of mixtures of doped semiconductor nanophosphors.

In these latest examples, the lamp 30 (or lamp 40) could use a variety of different combinations of doped semiconductor nanophosphors alone or in combination with other phosphor(s) to produce such an output. Examples of suitable doped type semiconductor nanophosphors are available from NNCrystal of Fayetteville, Ark. In a specific example, one or more of the doped semiconductor nanophosphors comprise zinc selenide quantum dots doped with manganese or copper. The selection of one or more such nanophosphors excited mainly by the low end (460 nm or below) of the visible spectrum and/or by UV energy together with dispersion of the nanophosphors in an otherwise clear material minimizes any potential for discolorization of the lamp when the lamp in its off-state that might otherwise be caused by the presence of a phosphor material.

FIG. 7A is a radiation spectrum graph showing a wavelength range in the visible spectrum from 400 nm to 700 nm.

The four curves shown on that graph represent the four different emission spectra of the exemplary blue, green, orange and red semiconductor nanophosphors used in the specific examples. The graph of FIG. 7A shows the phosphor emissions as having the same output intensity level, e.g. in a fashion normalized with respect to intensity.

In FIG. 7A, the leftmost curve represents the blue phosphor emissions. The blue phosphor is a doped semiconductor type nanophosphor. Although not shown, the absorption spectrum for this phosphor will include the 380-420 nm near UV range and extend into the UV range, but that absorption spectrum drops substantially to 0 (has an upper limit) about 450 or 460 nm. This phosphor exhibits a large Stokes shift from the short wavelength(s) of absorbed light to the longer wavelengths of re-emitted light. The emission spectrum of this blue phosphor has a broad peak in the wavelength region humans perceive as blue, e.g. centered around a wavelength approximately in the range of 470 to 475 nm in the illustrated example. The main peak of the emission spectrum of the phosphor is well above the absorption spectra of the various other semiconductor nanophosphors and well above its own absorption spectrum, although in the case of the blue example, there may be just a small amount of emissions in the region of the phosphor absorption spectra. As a result, blue emissions from this doped semiconductor nanophosphor would re-excite that phosphor at most a minimal amount. The absorption spectrum at or below 460 nm would be below the emission spectrum of the other three phosphors. Hence, the blue phosphor emissions would be subject to relatively little phosphor re-absorption, even in mixtures containing the other semiconductor nanophosphors. As shown, however, the blue phosphor provides a relatively broad radiation spectrum, as might appear as a pastel blue to a human observer.

In FIG. 7A, the next curve represents the green phosphor emissions. The green phosphor is another doped semiconductor nanophosphor. The absorption spectrum for this phosphor includes the 380-420 nm near UV range and extends down into the UV range, but that absorption spectrum drops substantially to 0 (has an upper limit) somewhere around or a bit below 450 nm. As noted, the phosphor exhibits a large Stokes shift from the short wavelength(s) of absorbed light to the longer wavelengths of re-emitted light. The emission spectrum of this green phosphor has a fairly broad peak in the wavelength region humans perceive as green, e.g. centered around approximately 550 nm in the illustrated example. Again, the emission spectrum of this phosphor is well above the absorption spectra of the other doped semiconductor nanophosphors and well above its own absorption spectrum. The absorption spectrum at or below 460 nm would be below the emission spectrum of the other three phosphors, except possibly for some small overlap with the blue emission spectrum. As a result, green emissions from the second doped semiconductor nanophosphor would not re-excite that phosphor and would not substantially excite the other semiconductor nanophosphors if mixed together. Stated another way, the green phosphor emissions would be subject to little or no phosphor re-absorption, even in mixtures containing the other doped semiconductor nanophosphors. As shown, however, the green phosphor provides a relatively broad radiation spectrum, as might appear as a pastel green to a human observer.

The third line of the graph shows the emission spectrum for a orange emitting doped semiconductor nanophosphor. Although not shown, the absorption spectrum for this third phosphor also includes the 380-420 nm near UV range and extends down into the UV range, but that absorption spectrum drops substantially to 0 (has an upper limit) about 450 or 460 nm. This phosphor also exhibits a large Stokes shift from the short wavelength(s) of absorbed light to the longer wavelengths of re-emitted light. The emission spectrum of this phosphor has a broad peak in the wavelength region humans perceive as orange, e.g. centered around a wavelength in a range of say 600-610 nm in the illustrated example. Again, the emission spectrum of the phosphor is well above the illustrated absorption spectra of the other doped semiconductor nanophosphors and well above its own absorption spectrum. The absorption spectrum at or below 460 nm would be below the emission spectrum of the other three phosphors, except possibly for some small overlap with the blue emission spectrum. As a result, orange emissions from the third doped semiconductor nanophosphor would not substantially re-excite that phosphor and would not substantially excite the other semiconductor nanophosphors if mixed together. Stated another way, the orange phosphor emissions also should be subject to little or no phosphor re-absorption, even in mixtures containing the other semiconductor nanophosphors. As shown, however, the orange phosphor provides a relatively broad radiation spectrum, as might appear as a pastel orange to a human observer.

For example, to increase the emissions of the lamp at the higher wavelength range of the 210 nm wide portion of the visible spectrum, the mixture used further includes a red emitting phosphor. Although doped semiconductor nanophosphors could be used, this example, assumes that the red phosphor is a cadmium based semiconductor nanophosphor (non-doped). Although not shown, the absorption spectrum for this fourth phosphor also includes the 380-420 nm near UV range. Depending on the phosphor used, the absorption spectrum may extend down into the UV range or may extend somewhat up into the blue range. In the later case, the red phosphor may be somewhat subject to more re-absorption of and excitation in response to emissions from the other phosphors, than was the case for the doped semiconductor nanophosphors. The emission spectrum of this fourth phosphor has a broad peak in the wavelength region humans perceive as red, e.g. centered approximately around 650 nm in the example.

Doped semiconductor nanophosphors exhibit a large Stokes shift, that is to say from a short-wavelength range of absorbed energy up to a fairly well separated longer-wavelength range of emitted light. FIG. 7B shows the absorption and emission spectra of three examples of doped semiconductor nanophosphors. Each line of the graph also includes an approximation of the emission spectra of the 405 nm LED chip, to help illustrate the relationship of the 405 nm LED emissions to the absorption spectra of the exemplary doped semiconductor nanophosphors. The illustrated spectra are not drawn precisely to scale but in a manner to provide a teaching example to illuminate our discussion here.

The top line (a) of the graph shows the absorption and emission spectra for an orange emitting doped semiconductor nanophosphor. The absorption spectrum for this first phosphor includes the 380-420 nm near UV range, but that absorption spectrum drops substantially to 0 (has an upper limit) somewhere around or a bit below 450 nm. As noted, the phosphor exhibits a large Stokes shift from the short wavelength(s) of absorbed light to the longer wavelengths of re-emitted light. The emission spectrum of this first phosphor has a fairly broad peak in the wavelength region humans perceive as orange. Of note, the emission spectrum of this first phosphor is well above the illustrated absorption spectra of the other doped semiconductor nanophosphors and well above its own absorption spectrum. As a result, orange emissions from the first doped semiconductor nanophosphor would not re-excite that phosphor and would not excite the other doped semiconductor nanophosphors if mixed together. Stated another way, the orange phosphor emissions would be subject to little or no phosphor re-absorption, even in mixtures containing one or more of the other doped semiconductor nanophosphors.

The next line (b) of the graph in FIG. 7B shows the absorption and emission spectra for a green emitting doped semiconductor nanophosphor. The absorption spectrum for this second phosphor includes the 380-420 nm near UV range, but that absorption spectrum drops substantially to 0 (has an upper limit) about 450 or 460 nm. This phosphor also exhibits a large Stokes shift from the short wavelength(s) of absorbed light to the longer wavelengths of re-emitted light. The emission spectrum of this second phosphor has a broad peak in the wavelength region humans perceive as green. Again, the emission spectrum of the phosphor is well above the illustrated absorption spectra of the other doped semiconductor nanophosphors and well above its own absorption spectrum. As a result, green emissions from the second doped semiconductor nanophosphor would not re-excite that phosphor and would not excite the other doped semiconductor nanophosphors if mixed together. Stated another way, the green phosphor emissions also should be subject to little or no phosphor re-absorption, even in mixtures containing one or more of the other doped semiconductor nanophosphors.

The bottom line (c) of the graph in FIG. 7B shows the absorption and emission spectra for a blue emitting doped semiconductor nanophosphor. The absorption spectrum for this third phosphor includes the 380-420 nm near UV range, but that absorption spectrum drops substantially to 0 (has an upper limit) about 450 or 460 nm. This phosphor also exhibits a large Stokes shift from the short wavelength(s) of absorbed light to the longer wavelengths of re-emitted light. The emission spectrum of this third phosphor has a broad peak in the wavelength region humans perceive as blue. The main peak of the emission spectrum of the phosphor is well above the illustrated absorption spectra of the other doped semiconductor nanophosphors and well above its own absorption spectrum. In the case of the blue example, there is just a small amount of emissions in the region of the phosphor absorption spectra. As a result, blue emissions from the third doped semiconductor nanophosphor would re-excite that phosphor at most a minimal amount. As in the other phosphor examples of FIG. 7, the blue phosphor emissions would be subject to relatively little phosphor re-absorption, even in mixtures containing one or more of the other doped semiconductor nanophosphors.

Examples of suitable orange, green and blue emitting doped semiconductor nanophosphors of the types generally described above relative to FIG. 7B are available from NNCrystal of Fayetteville, Ark.

As explained above, the large Stokes shift results in negligible re-absorption of the visible light emitted by doped semiconductor nanophosphors. This allows the stacking of multiple phosphors. It becomes practical to select and mix two, three or more such phosphors in a manner that produces a particular desired spectral characteristic in the combined light output generated by the phosphor emissions.

Figure 8A:
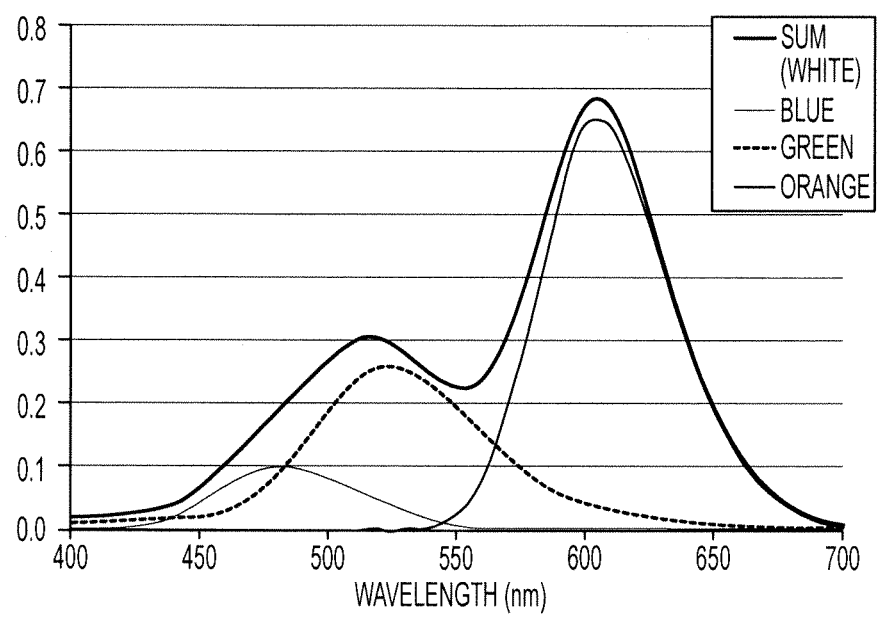
FIG. 8A is a graph of emission spectra of three of the doped semiconductor nanophosphors selected for use in an exemplary lamp as well as the spectrum of the white light produced by combining the spectral emissions from those three phosphors.

FIG. 8A graphically depicts emission spectra of three of the doped semiconductor nanophosphors selected for use in an exemplary lamp as well as the spectrum of the white light produced by summing or combining the spectral emissions from those three phosphors. For convenience, the emission spectrum of the LED has been omitted from FIG. 8A, on the assumption that a high percentage of the 405 nm light from the LED is absorbed by the phosphors. Although the actual output emissions from the fixture may include some near UV light from the LED, the contribution thereof if any to the sum in the output spectrum should be relatively small.

Although other combinations are possible based on the nanophosphors discussed above relative to FIGS. 7A-7B or based on other semiconductor nanophosphor materials, the example of FIG. 8A represents emissions of blue, orange and green phosphors. The emission spectra of the blue, orange and green emitting doped semiconductor nanophosphors are similar to those of the corresponding color emissions shown in FIG. 7B. Light is additive. Where the lamp includes the blue, orange and green emitting doped semiconductor nanophosphors, the addition of the blue, orange and green emissions produces a combined spectrum as approximated by the top or 'Sum' curve in the graph of FIG. 8A.

Various mixtures of doped semiconductor nanophosphors will produce white light emissions from a lamp that exhibit CRI of 75 or higher. For an intended lamp specification, a particular mixture of phosphors is chosen so that the light output of the fixture exhibits color temperature in one of the following specific ranges along the black body curve: 2,725±145° Kelvin; 3,045±175° Kelvin; 3,465±245° Kelvin; 3,985±275° Kelvin; 4503±243° Kelvin; 5028±283° Kelvin; 5665±355° Kelvin; and 6530±510° Kelvin. In the example shown in FIG. 8A, the 'Sum' curve in the graph produced by the mixture of blue, green and orange emitting doped semiconductor nanophosphors would result in a white light output having a color temperature of 2800° Kelvin (within the 2,725±145° Kelvin range). That white output light also would have a CRI of 80 (higher than 75).

It is possible to add one or more additional nanophosphors, e.g. a fourth, fifth, etc., to the mixture to further improve the CRI. For example, to improve the CRI of the nanophosphor mix of FIGS. 7B and 8A, a doped semiconductor nanophosphor might be added to the mix with a broad emissions spectrum that is yellowish-green or greenish-yellow, that is to say with a peak of the phosphor emissions somewhere in the range of 540-570 nm, say at 555 nm.

Figure 8B:
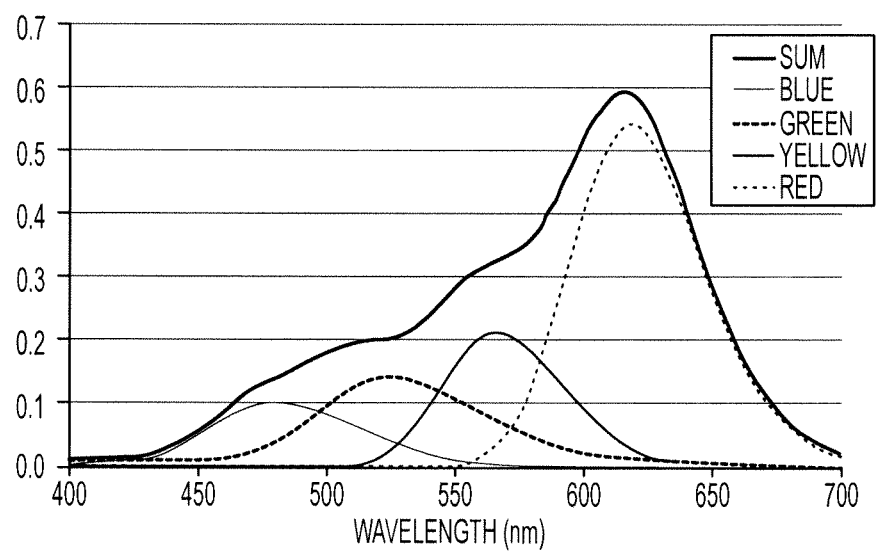
FIG. 8B is a graph of emission spectra of four doped semiconductor nanophosphors, in this case, for red, green, blue and yellow emissions, as well as the spectrum of the white light produced by combining the spectral emissions from those four phosphors.

Other mixtures also are possible, with two, three or more doped semiconductor nanophosphors. The example of FIG. 8B uses red, green and blue emitting semiconductor nanophosphors, as well as a yellow fourth doped semiconductor nanophosphor. Although not shown, the absorption spectra would be similar to those of the three nanophosphors discussed above relative to FIG. 7. For example, each absorption spectrum would include at least a portion of the 380-420 nm range. All four phosphors would exhibit a large Stokes shift from the short wavelength(s) of absorbed light to the longer wavelengths of re-emitted light, and thus their emissions spectra have little or not overlap with the absorption spectra.

In this example (FIG. 8B), the blue nanophosphor exhibits an emission peak at or around 484, nm, the green nanophosphor exhibits an emission peak at or around 516 nm, the yellow nanophosphor exhibits an emission peak at or around 580, and the red nanophosphor exhibits an emission peak at or around 610 nm. The addition of these blue, green, red and yellow phosphor emissions produces a combined spectrum as approximated by the top or 'Sum' curve in the graph of FIG. 8B. The 'Sum' curve in the graph represents a resultant white light output having a color temperature of 2600° Kelvin (within the 2,725±145° Kelvin range), where that white output light also would have a CRI of 88 (higher than 75).

As shown by the examples of FIGS. 7B-8B, the emission spectra of the various exemplary nanophosphors are substantially broader than the relatively monochromatic emission spectra of the LEDs. As shown by the graphs in FIGS. 8A and 8B, the emission spectra of some of the nanophosphors overlap, although the emissions peaks are separate. Such spectra represent pastel colors of relatively low purity levels. However, when added together, these emission spectra tend to fill-in gaps somewhat, so that there may be peaks but not individual spikes in the spectrum of the resultant combined output light. Stated another way, the visible output light tends to be at least substantially white of a high quality when observed by a person. Although not precisely white in the electromagnetic sense, the light formed by combining or summing the emissions from the phosphors may approach a spectrum corresponding to that of a black body. Of the two examples, the 'sum' curve for the white light in the example of FIG. 8B comes closer to the spectrum of light corresponding to a point on the black body curve over a wavelength range from about 425 nm to about 630 nm, although the peak in the example somewhat exceeds the black body spectrum and the exemplary sum spectrum falls off somewhat faster after that peak.

In several examples offering particular high spectral white light quality, the visible light output of the lamp deviates no more than ±50% from a black body radiation spectrum for the rated color temperature for the device, over at least 210 nm of the visible light spectrum. Also, the visible light output of the device has an average absolute value of deviation of no more than 15% from the black body radiation spectrum for the rated color temperature for the device, over at least the 210 nm of the visible light spectrum.

With any of these doped semiconductor nanophosphor strategies using emitters rated to emit energy of wavelengths from the blue/green region around 460 nm down into the UV range below 380 nm, the implementations can use different nanophosphor/phosphor combinations/mixtures deployed via different instances of the inner member 34 to produce lamps with white light output at different color temperatures at the specified high spectral quality.

While the foregoing has described what are considered to be the best mode and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings.

What is claimed is:

1. A light engine for a lamp, comprising:
   a heat sink having:
   (a) a first modular-coupling for attachment of a lighting industry standard lamp base, the first modular-coupling being configured for compatibility with each of a plurality of different lighting industry standard lamp bases each configured to connect the lamp to and provide electrical contact of the lamp with a corresponding lamp socket, and
   (b) a second modular-coupling for attachment of one of a plurality of different types of bulbs;
   a pedestal attached to and extending from the heat sink along a longitudinal axis of the light engine into a region to be surrounded by a bulb when the bulb is attached to the heat sink, the pedestal providing heat conductivity to and being supported by the heat sink; and
   a plurality of solid state light emitters configured to emit light,
   an end portion of the pedestal to be surrounded by the bulb having: at least three substantially flat surfaces facing outward from the longitudinal axis of the lamp in different directions each supporting one or more of the solid state light emitters for emission of light in a different orientation, and an end face facing at least substantially along the longitudinal axis of the lamp supporting one or more of the solid state light emitters for emission of light on or about the longitudinal axis of the lamp, such that emissions outward from the pedestal from the solid state light emitters through the bulb when the bulb is attached to the heat sink approximate light source emissions from a filament of an incandescent lamp.

2. The light engine of claim 1, further comprising:
   an inner member, of a material that is at least partially light transmissive, positioned and configured radially around the solid state light emitters supported on the substantially flat surfaces and longitudinally around the one or more of the solid state light emitters supported on the end face of the pedestal, between an inner surface of the bulb and the solid state light emitters on the pedestal and at distances from the inner surface of the bulb and the solid state emitters on the pedestal.

3. The light engine of claim 2, further comprising:
   at least one semiconductor nanophosphor, remotely deployed in the light engine with respect to the solid state light emitters via the inner member, each semiconductor nanophosphor being of a type for converting at least some portion of light from the solid state light emitters from a first spectral characteristic to a second spectral characteristic, to produce a white light output of the light engine for emission via the bulb, wherein:
   each semiconductor nanophosphor is of a type for converting at least some portion of a near UV wavelength range from the solid state emitter,
   visible light output from the light engine produced upon excitation of the semiconductor nanophosphors by light from the solid state emitters is at least substantially white,
   the substantially white light output from the light engine has a color rendering index (CRI) of 75 or higher, and
   the substantially white light output from the light engine has a color temperature in one of the following ranges:
   2,725±145° Kelvin;
   3,045±175° Kelvin;
   3,465±245° Kelvin;
   3,985±275° Kelvin;
   4503±243° Kelvin;
   5028±283° Kelvin;
   5665±355° Kelvin; and
   6530±510° Kelvin.

4. The light engine of claim 2, wherein the inner member comprises:
   a cylinder of a material that is at least partially light transmissive, positioned and configured to radially surround the solid state light emitters on the flat surfaces of the pedestal; and
   a dome of a material that is at least partially light transmissive, positioned at an end of the cylinder, and positioned and configured longitudinally around the one or more of the solid state light emitters on the end face of the pedestal.

5. The light engine of claim 3, wherein the at least one semiconductor nanophosphor comprises a doped semiconductor nanophosphor.

6. The light engine of claim 3, wherein the substantially white light corresponds to a point on a black body radiation spectrum.

7. The light engine of claim 3, wherein the inner member comprises:

a cylinder of a material that is at least partially light transmissive, positioned and configured to radially surround the solid state light emitters on the flat surfaces of the pedestal; and a dome of a material that is at least partially light transmissive, positioned at an end of the cylinder, and positioned and configured longitudinally around the one or more of the solid state light emitters on the end face of the pedestal.

8. The light engine of claim 1, wherein the solid state light emitters are emitters for emitting light that is at least substantially white at a color temperature greater than 4,260° Kelvin.

9. The light engine of claim 1, wherein each of the solid state light emitters is rated with a principal wavelength of emission in a range of about 460 nm and below.

10. The light engine of claim 1, further comprising circuitry at least partially enclosed by the heat sink connected to drive the solid state emitters in response to electricity received from a lamp base when attached to the heat sink at the first modular-coupling.

11. The light engine of claim 1, wherein the heat sink has a third modular-coupling for attachment of one of a plurality of different light transmissive members so as to be located radially and longitudinally around and spaced from the solid state light emitters supported on the flat surfaces and the end face of the pedestal.

12. The light engine of claim 1, wherein the a first modular-coupling is configured for compatibility with two or more types of standard lamp bases selected from the group consisting of: an Edison base, a mogul base, a candelabra base, a bi-pin base, a three-way mogul lamp base and a three-way medium lamp base.

13. The light engine of claim 1, wherein:
the pedestal comprises a heat pipe having an end forming a cold interface connected to the heat sink, and
the end portion of the pedestal is a thermal core attached to an end of the heat sink forming a hot interface.

14. The light engine of claim 13, wherein the end of the heat pipe forming the cold interface includes one or more coils connected to the heat sink.

\* \* \* \* \*